United States Patent
Hyoto et al.

(10) Patent No.: US 6,943,129 B2
(45) Date of Patent: Sep. 13, 2005

(54) INTERCONNECTION STRUCTURE AND METHOD FOR DESIGNING THE SAME

(75) Inventors: Chihiro Hyoto, Kyoto (JP); Kiyoshi Mukai, Osaka (JP); Hidenori Shibata, Osaka (JP); Hiroyuki Tsujikawa, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/703,605

(22) Filed: Nov. 10, 2003

(65) Prior Publication Data

US 2004/0101996 A1 May 27, 2004

Related U.S. Application Data

(62) Division of application No. 10/101,267, filed on Mar. 20, 2002, now Pat. No. 6,710,449.

(30) Foreign Application Priority Data

Sep. 7, 2001 (JP) .................................... 2001-271114

(51) Int. Cl.$^7$ .............................................. H01L 21/82
(52) U.S. Cl. ...................... 438/926; 257/758; 257/760; 438/128
(58) Field of Search .................... 257/522, 758–760, 257/794, 797; 438/128, 408, 619, 622, 631, 761, 926

(56) References Cited

U.S. PATENT DOCUMENTS

| | | | |
|---|---|---|---|
| 5,652,465 | A | 7/1997 | Hosoda et al. |
| 5,869,880 | A | 2/1999 | Grill et al. |
| 5,960,311 | A | 9/1999 | Singh et al. |
| 5,970,238 | A | 10/1999 | Shibata et al. |
| 6,093,633 | A | 7/2000 | Matsumoto |
| 6,150,232 | A | 11/2000 | Chan et al. |
| 6,226,782 | B1 | 5/2001 | Nowak et al. |

FOREIGN PATENT DOCUMENTS

| | | |
|---|---|---|
| JP | 7-193125 A | 7/1995 |
| JP | 09081622 A | 3/1997 |
| JP | 2001-77115 | 3/2001 |

*Primary Examiner*—Asok Kumar Sarkar
(74) *Attorney, Agent, or Firm*—McDermott Will & Emery LLP

(57) ABSTRACT

A wiring pattern has been enlarged by mutually different values, thereby forming two enlarged wiring patterns are formed. Then, regions where the two enlarged wiring patterns overlap each other are removed, thereby forming a dummy pattern. Alternatively, a simple-figure pattern made of simple figures is formed and a dummy pattern is formed using the simple-figure pattern. A gap that is not wider than a predetermined value is located in a final wiring pattern made of the wiring pattern and the dummy pattern is defined as an air gap region. Thus, an interconnection structure incorporating air gaps between wiring patterns is formed.

6 Claims, 19 Drawing Sheets

H→|←  51

52

53

I→|←

54

55

56

J→|←

57

11

58

Raw5  11 57
       58

INTERCONNECTION STRUCTURE AND METHOD FOR DESIGNING THE SAME

This application is a divisional of application Ser. No. 10/101,267 filed Mar. 20, 2002 now U.S. Pat. No. 6,710,449.

BACKGROUND OF THE INVENTION

The present invention relates to an interconnection structure and a method for designing the same in a semiconductor integrated circuit device with an interconnection structure incorporating air gaps.

Recently, as semiconductor integrated circuits have been miniaturized, the operating speed of transistors has improved, and RC delay time of interconnection has occupied the majority of signal processing time. Accordingly, reduction of wire-to-wire capacitance is most effective in reducing the RC delay, which increases as the wire length is increased and the wiring is miniaturized. In addition, as a semiconductor integrated circuit device has been more densely integrated, the capacitance between wires disposed horizontally to a substrate has been rapidly increased as compared to the capacitance between wires disposed perpendicularly to the substrate. Specifically, the shrinkage rate of a horizontal wire-to-wire space is different from that of a perpendicular wire-to-wire space. If the design rule is reduced by one generation, the wire-to-wire space and the wire width are generally reduced to about 60–70% horizontally and to about 90% perpendicularly. Thus, the more the circuit is miniaturized, the wider the difference of the wire-to-wire spaces between the horizontal and perpendicular directions become. As a result, to suppress the increase in wire-to-wire capacitance caused by miniaturization of the semiconductor integrated circuit, techniques for reducing the dielectric constant between wires are needed.

As a known technique, a semiconductor integrated circuit with an interconnection structure incorporating air gaps that can reduce a signal delay caused by the interconnection to 40% as compared to usual techniques is being used. The interconnection structure incorporating air gaps is not a structure in which every region between wires is intentionally filled up with an insulating film, but a structure in which air gaps are formed within the insulating film by utilizing a plasma CVD film with a low coverage.

By providing such an interconnection structure incorporating air gaps to a semiconductor integrated circuit device, it is possible to reduce a real relative dielectric constant between wires significantly and also to reduce the delay time depending on the wire-to-wire capacitance to 40% as compared to usual techniques.

At present, no method for designing a semiconductor integrated circuit device suitable for the interconnection structure incorporating air gaps has been established. In the interconnection structure incorporating air gaps, if air gaps occupy too much space in each interconnect layer, the strength of the interconnection structure might not be sufficiently secured. On the other hand, in reducing the delay depending on the parasitic capacitance between wires, so long as wires are spaced apart from each other by a certain distance or more, no substantial problem occurs because the parasitic capacitance is reduced.

SUMMARY OF THE INVENTION

It is therefore an object of the present invention to provide an interconnection structure, in which the strength thereof can be maintained and the delay depending on the parasitic capacitance between wires can be reduced. It is another object of the present invention to produce a method for designing wiring to obtain the structure.

A first inventive method for designing an interconnection structure of an interconnect layer in a semiconductor integrated circuit device, includes the steps of: a) forming a first dummy pattern so that at least part of the first dummy pattern is spaced apart from an actual wiring pattern by a distance equal to or smaller than a first value; b) combining the actual wiring pattern with at least the part of the first dummy pattern, thereby forming a final wiring pattern; and c) defining a gap in the final wiring pattern with a value equal to or smaller than the first value as an air gap region, in the interconnect layer.

According to this method, when an interconnection structure is formed using the final wiring pattern, gaps with a value equal to or smaller than the first value are turned into air gap regions. Some of these gaps are located in the actual wiring pattern, some are located in the dummy pattern, and the others are located between the actual wiring pattern and the first dummy pattern. Thus, air gap regions are created so as to surround almost the entire actual wiring pattern, and a structure incorporating air gaps in which no insulating film exists between the actual wiring pattern and the dummy pattern is formed. As a result, wire-to-wire capacitance can be suppressed.

In one embodiment of the present invention, the step a) may include the sub-steps of: a1) enlarging the actual wiring pattern by the first value, thereby forming a first enlarged wiring pattern; a2) enlarging the actual wiring pattern by a second value, which is larger than the first value, thereby forming a second enlarged wiring pattern; and a3) removing part of the second enlarged wiring pattern where the first and second enlarged wiring patterns overlap each other, thereby forming the first dummy pattern. Then, the first dummy pattern can be easily formed so that at least part of the first dummy pattern is spaced apart from the actual wiring pattern by the first value or smaller, using the enlarged patterns of the actual wiring pattern.

In another embodiment, the first inventive method may include the step a') of forming, in the interconnect layer, a second dummy pattern at a position apart from either the actual wiring pattern or the first dummy pattern by the first value in a region where neither the actual wiring pattern nor the first dummy pattern exists, between the steps a) and b). In the step b), the actual wiring pattern and the first and second dummy patterns may be combined, thereby forming the final wiring pattern. Then, a lager number of air gap regions can be created.

In this particular embodiment, in the step a'), it is preferable that after a simple-figure pattern made of simple figures has been formed, the actual wiring pattern and the first dummy pattern are respectively enlarged by a third value, which is larger than the first value, thereby forming a third enlarged wiring pattern, and then part of the third enlarged wiring pattern where the third enlarged wiring pattern and the simple-figure pattern overlap each other is removed, thereby forming the second dummy pattern. Then, a larger number of air gap regions can be created using the simple-figure pattern.

In still another embodiment, the first inventive method may include the steps of: a") forming a lattice dummy pattern between the steps a) and b); and a'") forming a separated dummy pattern by separating the first dummy pattern using the lattice dummy pattern. In the step b), the separated dummy pattern, which is part of the first dummy pattern, and the actual wiring pattern may be combined, thereby forming the final wiring pattern. Then, the parasitic capacitance between the first wiring pattern and the first dummy pattern can be reduced. As a result, the effect of suppressing a signal delay depending on the parasitic capacitance between wires can be remarkably exhibited.

In yet another embodiment, in the step a), the first dummy pattern may be formed using the first simple-figure pattern made of simple figures. Then, air gap regions can be easily created.

In this particular embodiment, the step a) preferably includes the sub-steps of: a11) forming the first simple-figure pattern; a12) enlarging the actual wiring pattern by a third value, which is larger than the first value, thereby forming a third enlarged wiring pattern; and a13) removing part of the third enlarged wiring pattern where the third enlarged wiring pattern and the first simple-figure pattern overlap each other, thereby forming the first dummy pattern. Then, the first dummy pattern can be easily formed so that at least part of the first dummy pattern is apart from the actual wiring pattern by a distance equal to or smaller than the first value, using the simple-figure pattern.

In an alternative embodiment, the step a) preferably includes the sub-steps of: a21) forming the first simple-figure pattern; a22) removing part of the first simple-figure pattern where the first simple-figure pattern and the actual wiring pattern overlap each other, thereby forming a second simple-figure pattern; a23) shrinking the second simple-figure pattern by a fourth value, thereby forming a shrunk simple-figure pattern; a24) enlarging the shrunk simple-figure pattern by the fourth value, thereby forming a third simple-figure pattern; a25) removing part of the second simple-figure pattern where the second and third simple-figure patterns overlap each other, thereby forming a fourth simple-figure pattern; a26) enlarging the fourth simple-figure pattern by a fifth value, thereby forming an enlarged simple-figure pattern; a27) enlarging the actual wiring pattern by the first value, thereby forming a first enlarged wiring pattern; a28) removing part of the enlarged simple-figure pattern where the enlarged simple-figure pattern and the first enlarged wiring pattern overlap each other, thereby forming a fifth simple-figure pattern; and a29) combining the fifth and third simple-figure patterns, thereby forming the first dummy pattern. Then, a larger number of air gap regions can be created using the simple-figure patterns.

In another alternative embodiment, in the step a), the first dummy pattern is preferably formed using a striped dummy pattern formed by separating the first simple-figure pattern into striped pieces.

In this particular embodiment, the step a) more preferably includes the sub-steps of: a31) forming the first simple-figure pattern; a32) removing part of the first simple-figure pattern where the first simple-figure pattern and the actual wiring pattern overlap each other, thereby forming the second simple-figure pattern; a33) shrinking the second simple-figure pattern in one direction by the fifth value, thereby forming a first shrunk simple-figure pattern; a34) shrinking the first shrunk simple-figure pattern in one direction by a sixth value, thereby forming a second shrunk simple-figure pattern; a35) removing part of the first simple-figure pattern where the first and second simple-figure patterns overlap each other, thereby forming a sixth simple-figure pattern; and a36) combining the sixth simple-figure pattern with the second shrunk simple-figure pattern, thereby forming the striped dummy pattern. Then, capacitance between the actual wiring pattern and the first dummy pattern can be reduced. As a result, a signal delay depending on the parasitic capacitance between wires can be effectively suppressed.

A second inventive method for designing an interconnection structure of an interconnect layer in a semiconductor integrated circuit device, includes the steps of: a) forming a dummy pattern, which is in contact with an actual wiring pattern; b) combining the actual wiring pattern with the dummy pattern, thereby forming a final wiring pattern; and c) defining a region where a gap in the final wiring pattern has a value equal to or smaller than a first value as an air gap region, in the interconnect layer.

According to this method, even in a case where a gap in the actual wiring pattern is slightly wider than the first value and, therefore, it is difficult to form a dummy pattern for creating air gap regions, a dummy pattern for creating the air gap regions can be easily formed.

In one embodiment of the present invention, the step a) may include the sub-steps of: a41) enlarging the actual wiring pattern by a seventh value, thereby forming a fourth enlarged wiring pattern; a42) shrinking the fourth enlarged wiring pattern by the seventh value, thereby forming a first wire-to-wire pattern; a43) enlarging the actual wiring pattern by an eighth value, which is larger than the seventh value, thereby forming a fifth enlarged wiring pattern; a44) shrinking the fifth enlarged wiring pattern by the eighth value, thereby forming a second wire-to-wire pattern; a45) removing part of the second wire-to-wire pattern where the first and second wire-to-wire patterns overlap each other, thereby forming a third wire-to-wire pattern; a46) enlarging the actual wiring pattern by a ninth value, which is smaller than the seventh value, thereby forming a sixth enlarged wiring pattern; and a47) taking out part of the third wire-to-wire pattern where the third wire-to-wire pattern and the sixth enlarged wiring pattern overlap each other, thereby forming the dummy pattern.

A first inventive interconnection structure of an interconnect layer in a semiconductor integrated circuit device, includes: a wiring pattern formed in the interconnect layer; a dummy pattern formed in the interconnect layer so that at least part of the dummy pattern is spaced apart from the wiring pattern by a distance equal to or smaller than a predetermined value; an air gap region provided in each of gaps with a value equal to or smaller than the predetermined value, one of which is located in the wiring pattern, another of which is located in the dummy pattern, and still another of which is located between the wiring pattern and the dummy pattern, in the interconnect layer; and an interlevel dielectric film filling regions other than the air gap region in the interconnect layer.

In this structure, air gap regions are provided around the wiring pattern as many as possible, and thus a signal delay depending on the parasitic capacitance between wires can be reduced by using the dummy pattern.

In one embodiment of the present invention, the dummy pattern may be formed using a simple-figure pattern made of simple figures.

In another embodiment, part of the dummy pattern may be separated at regular intervals. Then, the parasitic capacitance in the wiring pattern can be reduced more effectively.

A second inventive interconnection structure of an interconnect layer in a semiconductor integrated circuit device, includes: a wiring pattern formed in the interconnect layer; a dummy pattern which is in contact with the wiring pattern in the interconnect layer and includes a gap having a predetermined value or smaller; an air gap region provided in each of gaps with a value equal to or smaller than the predetermined value, one of which is located in the wiring pattern, another of which is located in the dummy pattern, and still another of which is located between the wiring pattern and the dummy pattern, in the interconnect layer; and an interlevel dielectric film filling regions other than the air gap region in the interconnect layer.

In this structure, even in a case where a gap in a wiring pattern is slightly wider than a value that is a standard for creating an air gap region, an air gap region is created in the gap. Thus, a signal delay depending on the wire-to-wire capacitance in the interconnection can be suppressed by using the dummy pattern.

DESCRIPTION OF THE PREFERRED EMBODIMENTS

Basic Concept

For an interconnection structure incorporating air gaps and a method for designing the structure according to the present invention, the following definition is provided: if wires are spaced apart from each other by a value W or smaller within a range satisfying a design rule for a layout design of a wiring pattern, spaces between wires, which are almost completely filled with an insulating film in general, are not completely filled with an insulating film and a structure incorporating air gaps is formed. In the present invention, if a layout design rule satisfies a design rule for a wiring pattern (i.e., 0.25 $\mu$m) in a semiconductor fabrication process in which the gate length is 0.26 $\mu$m, for example, the value W is the distance of the wire-to-wire space that is equal to or smaller than 0.5 $\mu$m.

Basically, if this definition is applied to wires arranged horizontally to a substrate, the wire-to-wire capacitance can be effectively reduced. However, the definition is preferably applied to wires arranged perpendicularly or almost perpendicularly to the substrate. This is because the space between the wires is expected to be equal to or narrower than 0.5 $\mu$m in such a case.

Figure 19:
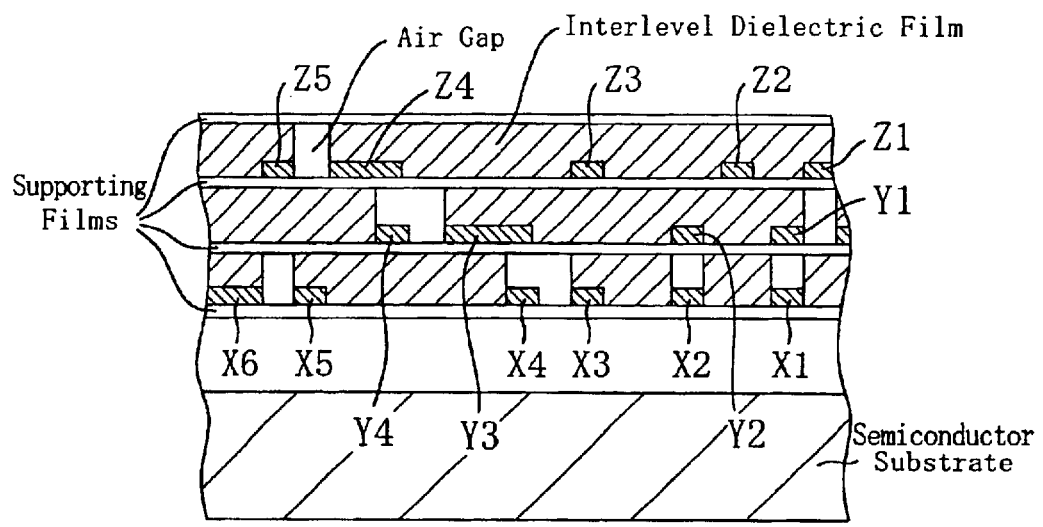
FIG. 19 is a cross-sectional view of a semiconductor device with a multilevel interconnection structure to be designed by a designing method according to the present invention.

FIG. 19 is a cross-sectional view of a semiconductor device with a multilevel interconnection structure to be designed by a designing method according to the present invention. Multiple devices such as MIS transistors are provided on a semiconductor substrate but are not shown in FIG. 19.

As shown in FIG. 19, suppose wires X1 to X6 are formed in a first interconnect layer, wires Y1 to Y4 are formed in a second interconnect layer, and wires Z1 to Z5 are formed in a third interconnect layer. In this case, the wires X3 to X6 are arranged horizontally to a substrate and the spaces between wires X3 and X4 and between wires X5 and X6 are narrower than a predetermined value in the first interconnect layer. Thus, air gaps are created in these spaces, while regions other than the air gaps are filled with an interlevel dielectric film. However, the wires X1, X2 of the first interconnect layer are respectively spaced apart from the wires Y1, Y2 of the second interconnect layer by a predetermined value or smaller, and thus air gaps are created over the wires X1 and X2. In addition, since the wire X4 of the first interconnect layer and the wire Y3 of the second interconnect layer are spaced by a predetermined value or smaller in a region where the wires X4 and Y3 overlap each other, air gaps are also created over the wire X4. The similar definition is applied to the second and third interconnect layers. As a result, an interconnection structure incorporating air gaps as shown in FIG. 19 is formed.

Embodiment 1

Figure 1:
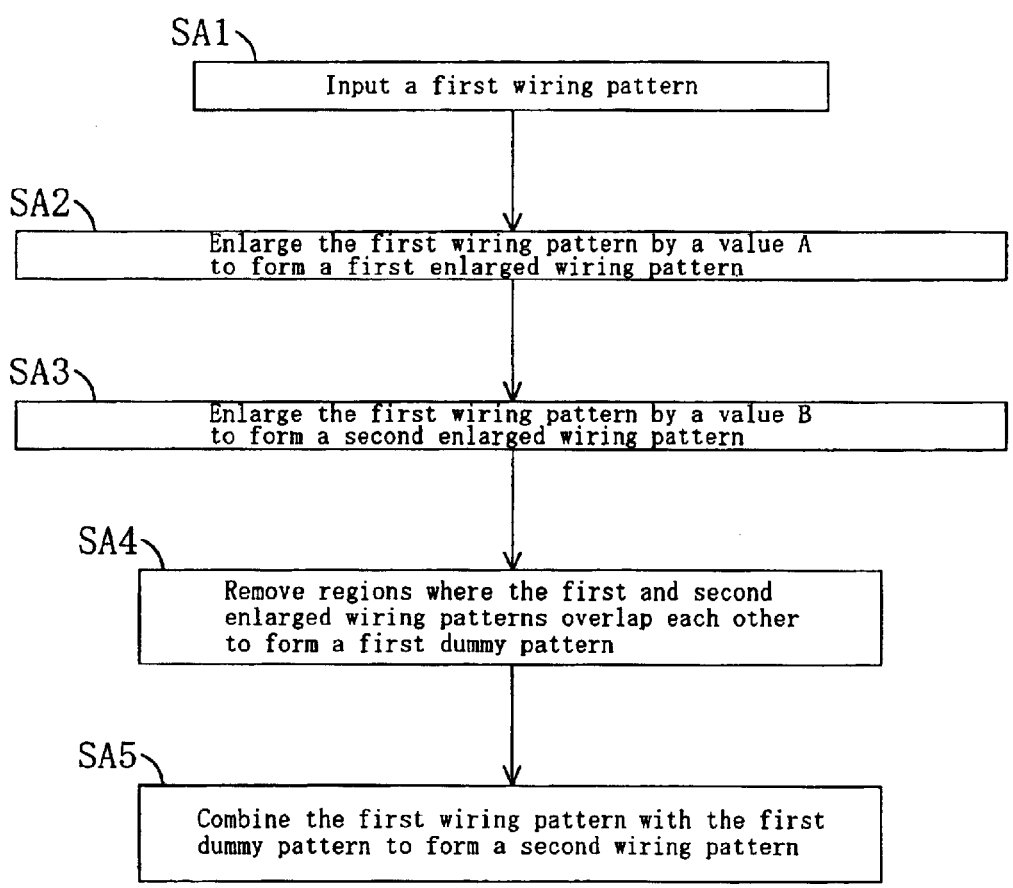
FIG. 1 is a flowchart illustrating a procedure of forming patterns for designing an interconnection structure according to a first embodiment of the present invention.
Figure 2:
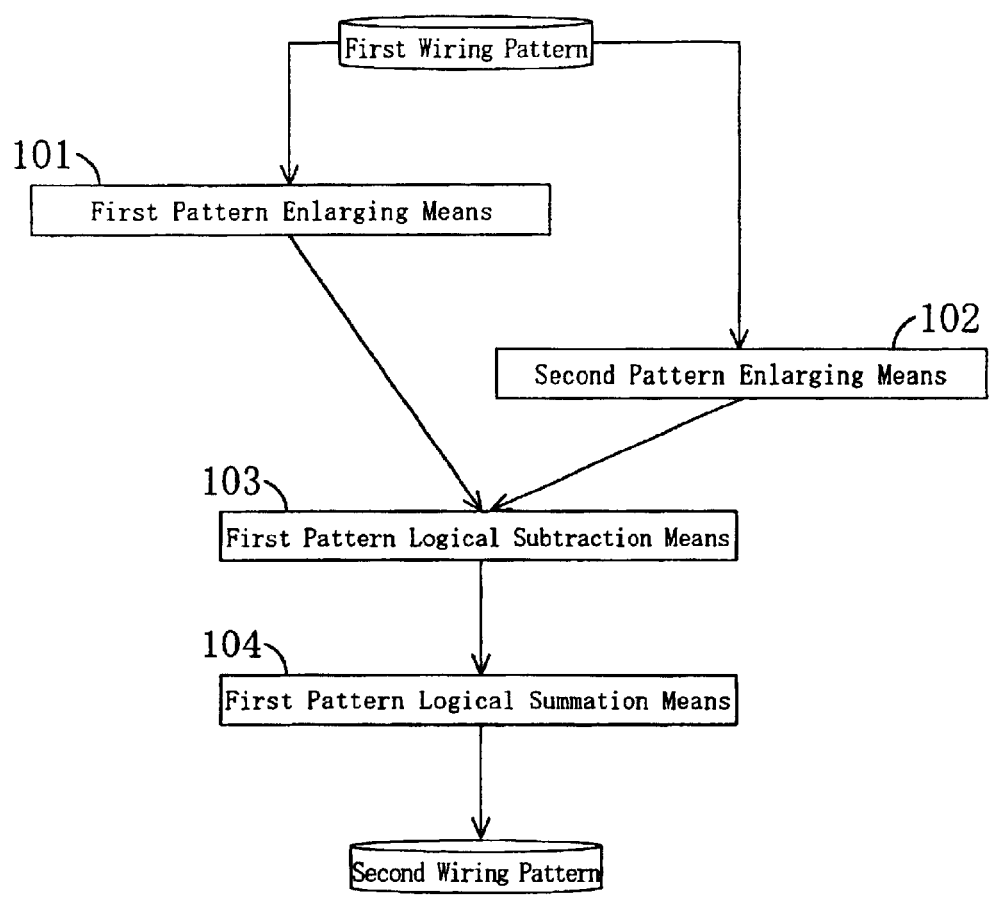
FIG. 2 is a block diagram schematically showing components of a pattern forming device in the first embodiment.

FIG. 1 is a flowchart illustrating a procedure of forming patterns for designing an interconnection structure according to a first embodiment of the present invention. FIG. 2 is a block diagram schematically showing components of a pattern forming device in the first embodiment. FIGS. 3A through 3E are plan views showing patterns formed during the pattern forming process for designing the interconnection structure of the first embodiment. Hereinafter, a pattern forming method for designing the interconnection structure of this embodiment will be described with reference to FIG. 2 and FIGS. 3A through 3E according to the flowchart in FIG. 1.

Figure 3A:
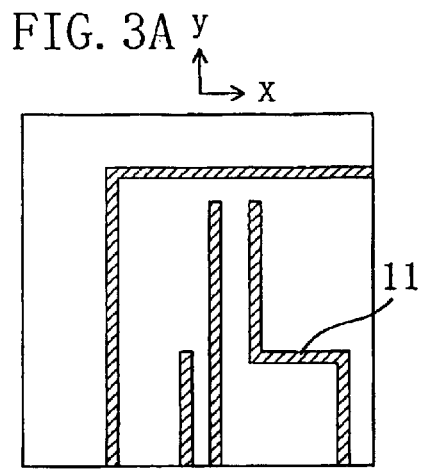
FIGS. 3A through 3E are plan views showing patterns formed during the pattern forming process for designing the interconnection structure of the first embodiment.

First, in Step SA1, a first wiring pattern 11, which is an actual wiring pattern and shown in FIG. 3A, is taken out from a data base used for a design and then input to a personal computer used for the design, for example.

Figure 3B:
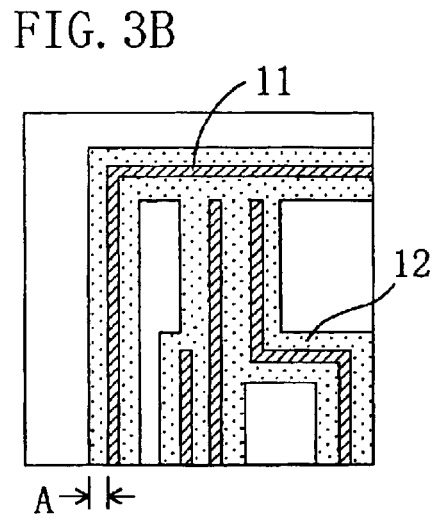
Figure 3C:
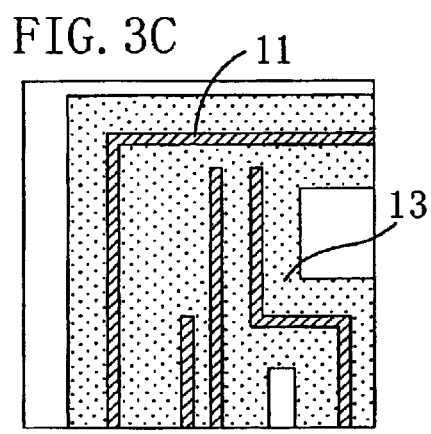

Next, in Step SA2, the first wiring pattern 11 is enlarged in the x and y directions by a predetermined value A (where A≦W and A is 0.5 μm, for example), thereby forming a first enlarged wiring pattern 12 shown in FIG. 3B. This process step is performed by first pattern enlarging means 101 shown in FIG. 2. In this case, the predetermined value A refers to a distance in which no pattern for creating air gap regions is allowed to be formed near the first wiring pattern 11. In this embodiment, the predetermined value A is equal to the value W of a space in which an air gap region is defined to be provided.

Then, in Step SA3, the first wiring pattern 11 is enlarged in the x and y directions by a predetermined value B (e.g., 0.75 μm), thereby forming a second enlarged wiring pattern 13 shown in FIG. 3B. This process step is performed by second pattern enlarging means 102 shown in FIG. 2. In this case, the predetermined value B satisfies a design rule for a wiring pattern (i.e., 0.25 μm in this embodiment) in a semiconductor fabrication process.

Subsequently, in Step SA4, part of the second enlarged wiring pattern 13 in which the first and second enlarged wiring patterns 12 and 13 overlap each other is removed, thereby forming a first dummy pattern 14 shown in FIG. 3D. This process step is performed by first pattern logical subtraction means 103 shown in FIG. 2.

Figure 3D:
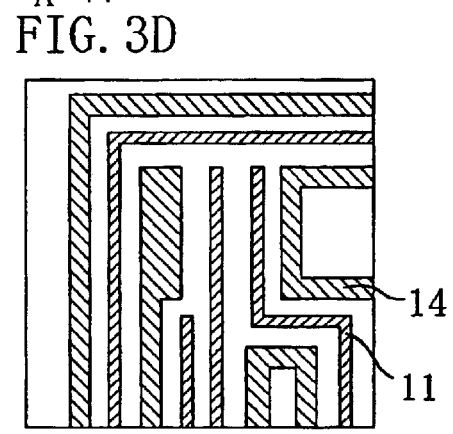
Figure 3E:
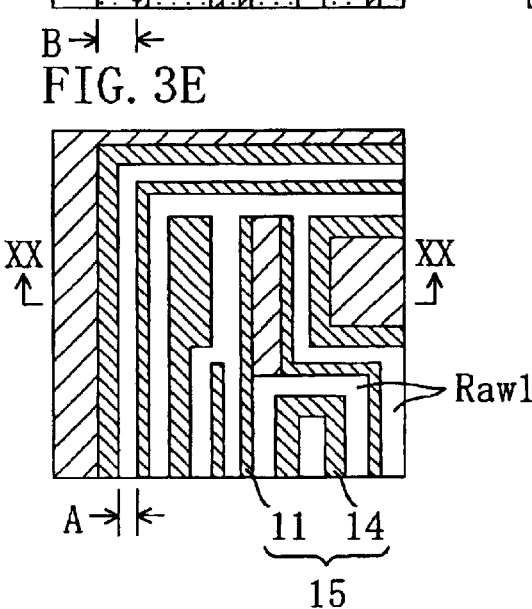

Then, in Step SA5, the first wiring pattern 11 shown in FIG. 3A and the first dummy pattern 14 shown in FIG. 3D are combined, thereby forming a second wiring pattern 15 shown in FIG. 3E. This process step is performed by first pattern logical summation means 104.

This second wiring pattern 15 is a final wiring pattern including the first wiring pattern 11 as an actual wiring pattern and the first dummy pattern 14. A conductive film is formed as the first dummy pattern 14. This conductive film is made of the same conductive material as that of the first wiring pattern, which is an actual wiring pattern, but does not function as wiring. In this embodiment, parts of the second wiring pattern 15 (which is the combination of the first wiring pattern 11 and the first dummy pattern 14) where wires are spaced by the value W or smaller are turned into air gap regions Raw1 where no insulating film exists. The air gap regions Raw1 are shown as blank spaces (i.e., regions other than the hatched regions) in FIG. 3E.

According to the first embodiment, the first dummy pattern 14 is formed around the first wiring pattern 11 which is an actual wiring pattern, and the first wiring pattern 11 and the first dummy pattern 14 are spaced by the predetermined value A. Thus, if a semiconductor device is fabricated using the second wiring pattern 15 that includes the first dummy pattern 14 formed by the pattern forming method for designing the interconnection structure of this embodiment, air gap regions where no insulating film exists are created between the first wiring pattern 11 and the first dummy pattern 14. As a result, wire-to-wire capacitance can be suppressed.

Figure 20:
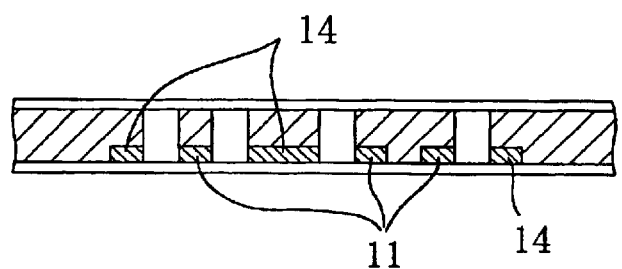
FIG. 20 is a vertical cross-sectional view of an interconnect layer taken along the line XX—XX in FIG. 3E.

FIG. 20 is a vertical cross-sectional view of an interconnect layer taken along the line XX—XX in FIG. 3E. As shown in FIG. 20, according to the method for designing the interconnection of this embodiment, the final wiring pattern including the dummy pattern is formed in an interconnect layer to be designed. Air gaps are created in parts of the interconnect layer where the wire-to-wire space is narrower than a predetermined value. As a result, the parasitic capacitance between wires can be reduced as intended.

Embodiment 2

Figure 4:
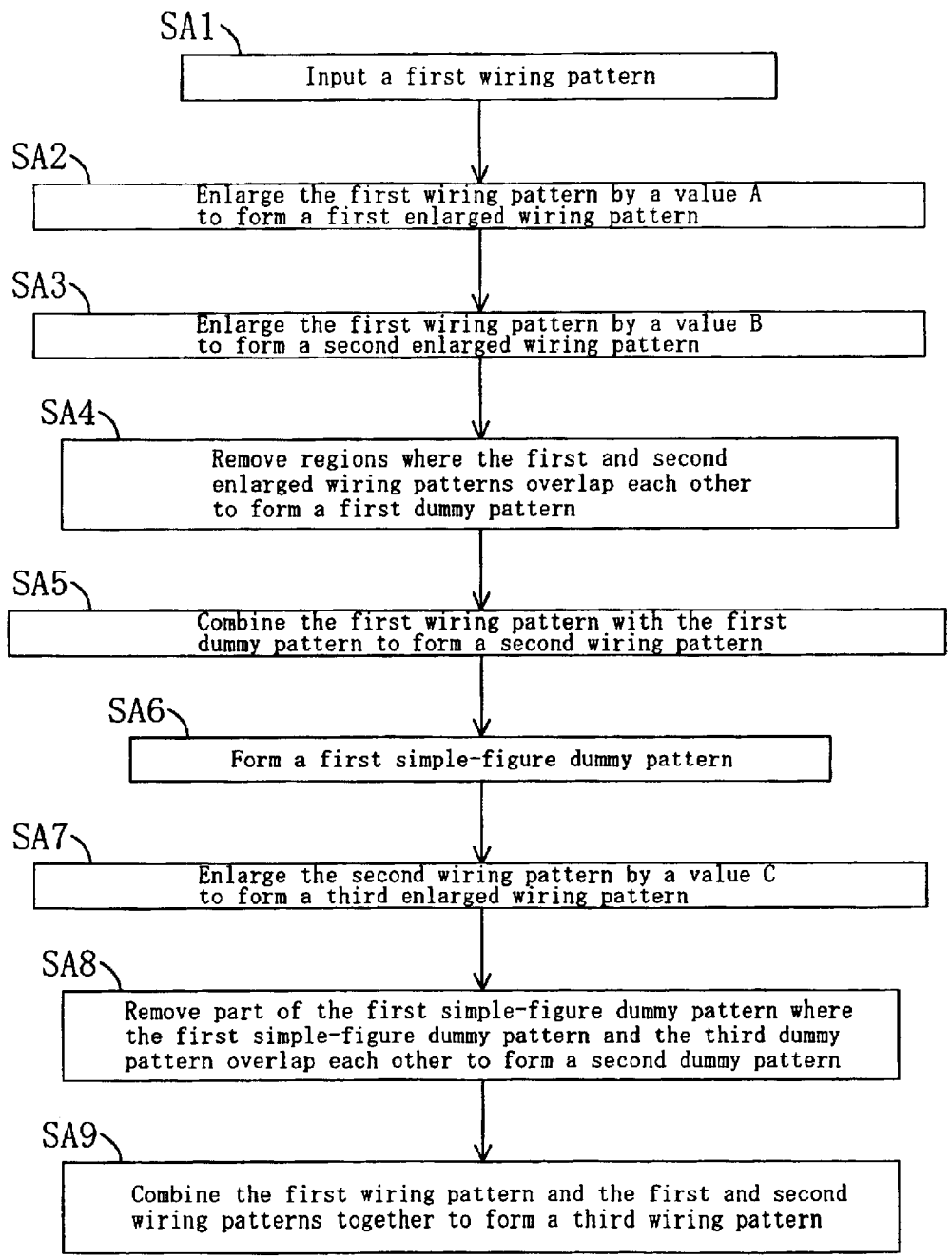
FIG. 4 is a flowchart illustrating a procedure of a pattern forming method for designing an interconnection structure according to a second embodiment of the present invention.
Figure 5:
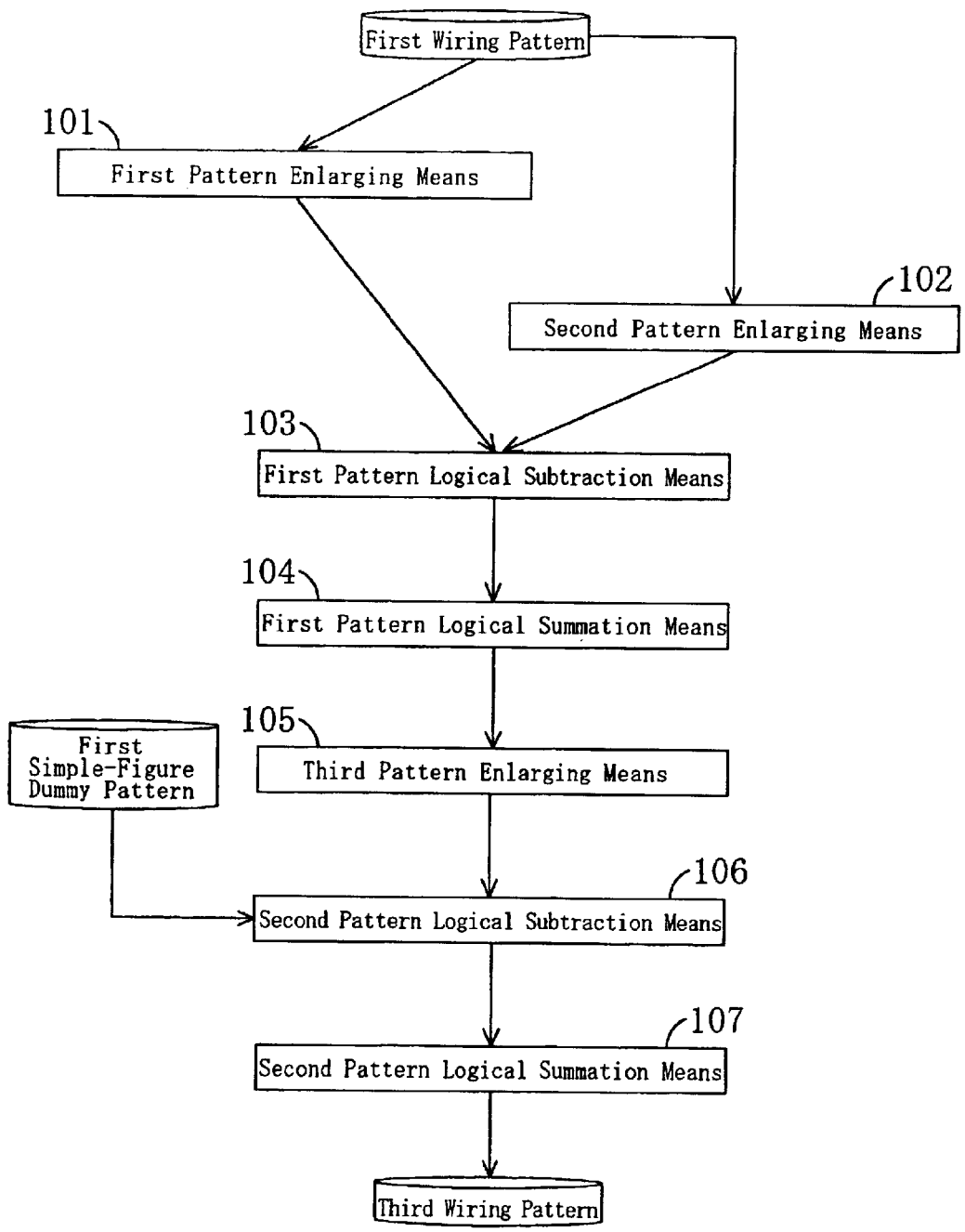
FIG. 5 is a block diagram schematically showing components of a pattern forming device in the second embodiment.

FIG. 4 is a flowchart illustrating a procedure of a pattern forming method for designing an interconnection structure according to a second embodiment of the present invention. FIG. 5 is a block diagram schematically showing components of a pattern forming device in the second embodiment. FIGS. 6A through 6D are plan views showing patterns formed during the pattern forming process for designing the interconnection structure of the second embodiment. Hereinafter, a pattern forming method for designing the interconnection structure of this embodiment will be described with reference to FIG. 5 and FIGS. 6A through 6D according to the flowchart shown in FIG. 4.

First, Steps SA1 through SA5 are preformed as in the first embodiment. Specifically, as shown in FIGS. 3A through 3E, the first wiring pattern 11 as an actual wiring pattern is enlarged in the x and y directions by a predetermined value A (where A≦W and A is 0.5 μm, for example), thereby forming a first enlarged wiring pattern 12. The first wiring pattern 11 is enlarged again in the x and y directions by a predetermined value B (e.g., 0.75 μm), thereby forming a second enlarged wiring pattern 13. In this embodiment, the predetermined value A is set to be equal to the value W. Then, part of the second enlarged wiring pattern 13 where the first and second enlarged wiring patterns 12 and 13 overlap each other is removed, thereby forming a first dummy pattern 14. Subsequently, the first wiring pattern 11 and the first dummy pattern 14 are combined, thereby forming a second wiring pattern 15. The foregoing process steps are performed by first pattern enlarging means 101, second pattern enlarging means 102, first pattern logical subtraction means 103, and first pattern logical summation means 104, shown in FIG. 2.

Figure 6A:
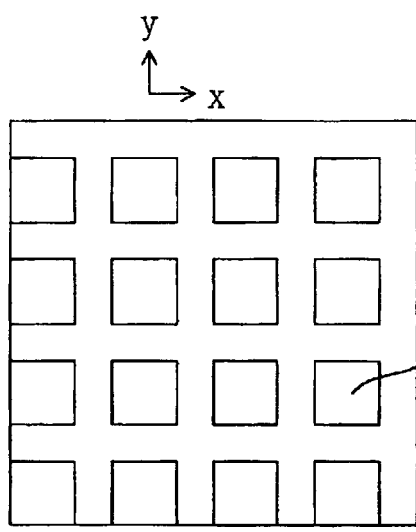
FIGS. 6A through 6D are plan views showing patterns formed during the pattern forming process for designing the interconnection structure of the second embodiment.
Figure 6B:
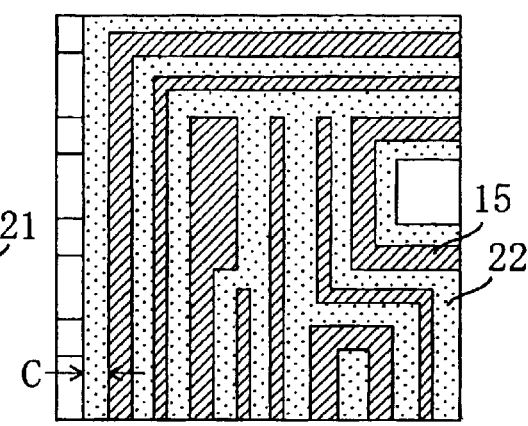

Next, according to this embodiment, in Step SA6, a first simple-figure dummy pattern 21, in which plural simple figures having the same shape such as a square are equally spaced in columns and rows, is formed as shown in FIG. 6A. In this case, the length of one side of the square constituting the first simple-figure dummy pattern 21 is set to the minimum value or larger satisfying a design rule for a wiring pattern in a semiconductor fabrication process. The squares are spaced apart from each other by a space for creating an air gap region.

Figure 6C:
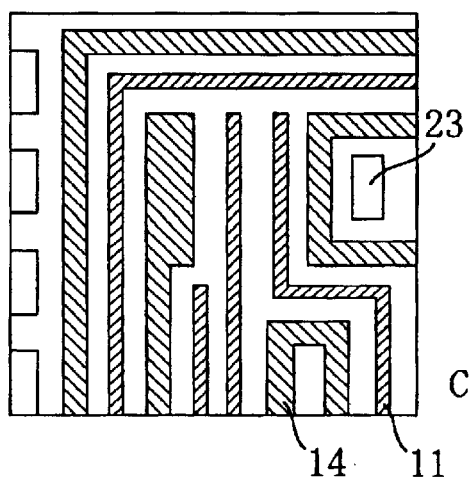
Figure 6D:
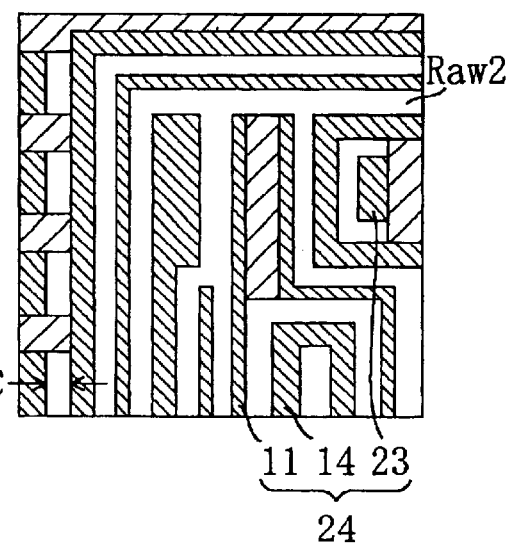

Next, in Step SA7, the second wiring pattern 15 shown in FIG. 3E is enlarged in the x and y directions by a predetermined value C (e.g., 0.5 μm), thereby forming a third enlarged wiring pattern 22 shown in FIG. 6D. This process step is performed by third pattern enlarging means 105 shown in FIG. 5. In this case, the predetermined value C refers to the width of a space in which an air gap region is defined to be created between the first wiring pattern 11 shown in FIG. 3A and a second dummy pattern 23 shown in FIG. 6C. The third enlarged wiring pattern 22 is a region in which no dummy pattern for forming an air gap region is allowed to be formed near the second wiring pattern 15.

Then, in Step SA8, pattern logical subtraction means is performed so as to remove part of the first simple-figure dummy pattern 21 where the first simple-figure dummy pattern 21 and the third enlarged wiring pattern 22 overlap each other, thereby forming the second dummy pattern 23 shown in FIG. 6C. This process step is performed by second pattern logical subtraction means 106 shown in FIG. 5.

Subsequently, in Step SA9, the wiring pattern 11 shown in FIG. 3A, the first dummy pattern 14, and the second dummy pattern 23 shown in FIG. 6C are combined, thereby forming a third wiring pattern 24 as shown in FIG. 6D. This process step is performed by second pattern logical summation means 107 shown in FIG. 5.

This third wiring pattern 24 is a final wiring pattern including the first wiring pattern 11 as an actual wiring pattern, the first dummy pattern 14, and the second dummy pattern 23. A conductive film is formed as the first and second dummy patterns 14 and 23. This conductive film is made of the same conductive material as that of the first wiring pattern 11, which is an actual pattern, but does not function as wiring. In this embodiment, parts of the third wiring pattern 24 where the wires are spaced by the value W or smaller are turned into air gap regions Raw2 where no insulating film exists. The air gap region Raw2 are shown as blank spaces (i.e., regions other than the hatched regions) in FIG. 6D.

Although not shown, according to the method for designing interconnection of this embodiment, as in the interconnection structure formed by the designing method of the first embodiment as shown in FIG. 20, a final wiring pattern including a dummy pattern is also formed in an interconnect layer to be designed. Air gap regions are created in parts of the interconnect layer where the wire-to-wire space is narrower than a predetermined value.

Thus, according to the second embodiment, the second dummy pattern 23 in which respective patterns are spaced with air gap regions interposed therebetween is formed in addition to the first dummy pattern 14, as in the first embodiment. Hence, if a semiconductor device is fabricated using the second dummy pattern 23, a lager number of air gap regions are created among the first wiring pattern 11 as an actual wiring pattern, the first dummy pattern 14, and the second dummy pattern 23. As a result, wire-to-wire capacitance can be effectively suppressed. In addition, in this embodiment, the third dummy pattern 23 based on the simple figures is formed between wiring patterns that are spaced by a value lager than the predetermined value C. Thus, no large air gap region is created between wiring patterns, and the flatness of the interconnect layer can be maintained.

In this embodiment, a square is used as the simple figure that is a basic component of the first simple-figure dummy pattern 21. Instead, a shape such as triangle, circle, or polygon may be used as the simple figure.

Embodiment 3

Figure 7:
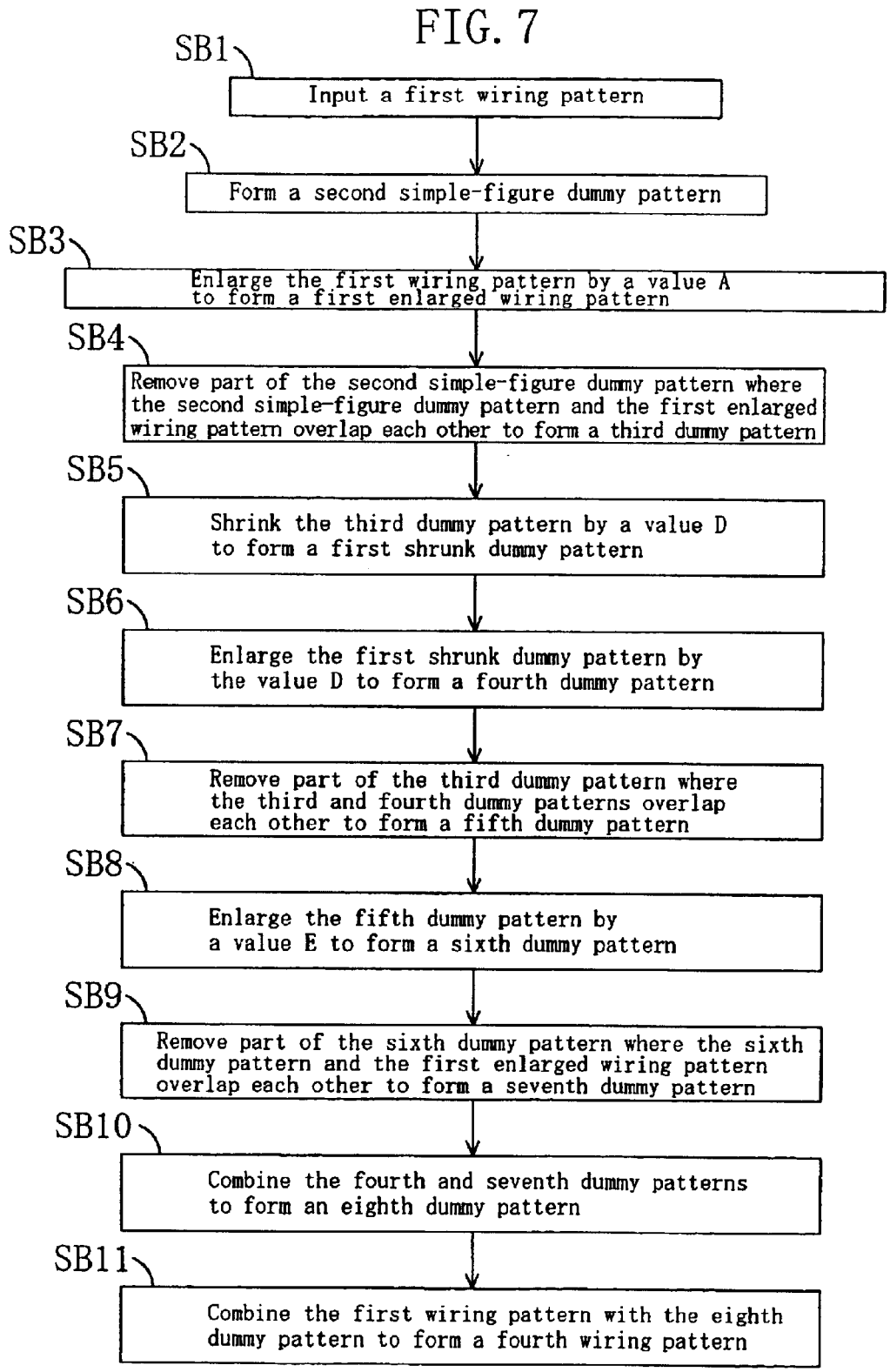
FIG. 7 is a flowchart illustrating a procedure of a pattern forming method for designing an interconnection structure according to a third embodiment of the present invention.
Figure 8:
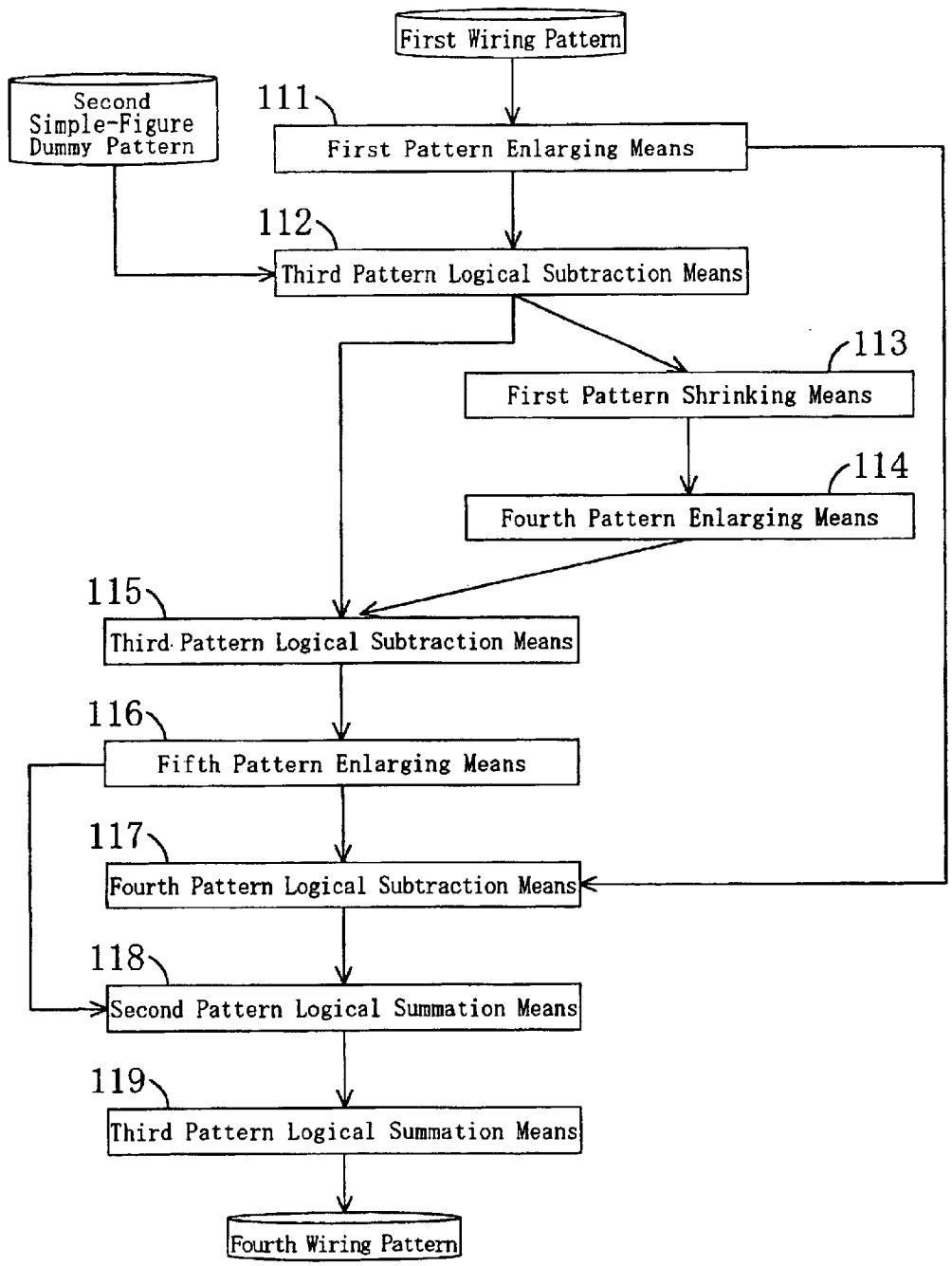
FIG. 8 is a block diagram schematically showing components of a pattern forming device in the third embodiment.

FIG. 7 is a flowchart illustrating a procedure of a pattern forming method for designing an interconnection structure according to a third embodiment of the present invention. FIG. 8 is a block diagram schematically showing components of a pattern forming device in the third embodiment. FIGS. 9A through 9I are plan views showing patterns formed during the pattern forming process for designing the interconnection structure of the third embodiment. Hereinafter, a pattern forming method for designing the interconnection structure of this embodiment will be described with reference to FIG. 8 and FIGS. 9A through 9I according to the flowchart shown in FIG. 7.

Figure 9A:
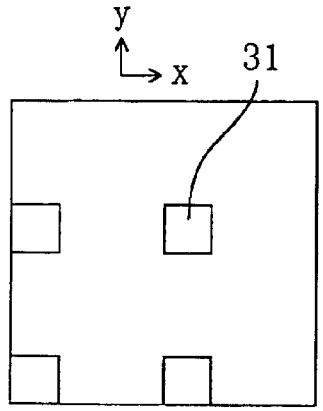
FIGS. 9A through 9I are plan views showing patterns formed during the pattern forming process for designing the interconnection structure of the third embodiment.

First, in Step SB1, a first wiring pattern 11, which is an actual wiring pattern and shown in FIG. 3A, is input. Next, in Step SB2, a second simple-figure dummy pattern 31 in which plural simple figures having the same shape such as a square are equally spaced in columns and rows is formed as shown in FIG. 9A. In this case, the length of one side of the square constituting the second simple-figure dummy pattern 31 is set to the minimum value or larger satisfying a design rule for a wiring pattern (i.e., 0.25 μm in this embodiment) in a semiconductor fabrication process.

Then, in Step SB3, the first wiring pattern 11 shown in FIG. 3A is enlarged in the x and y directions by a predetermined value A (e.g., 0.5 μm), thereby forming a first enlarged wiring pattern 12 shown in FIG. 3B. This process step is performed by first pattern enlarging means 111 shown in FIG. 8. In this case, the predetermined value A is equal to the width of a space for an air gap region to be created between the first wiring pattern 11 shown in FIG. 3A and an eighth dummy pattern 38 shown in FIG. 9H. As in the first embodiment, the first enlarged wiring pattern 12 is a region in which no dummy pattern for creating air gap regions is allowed to be formed near the first wiring pattern 11.

Figure 9B:
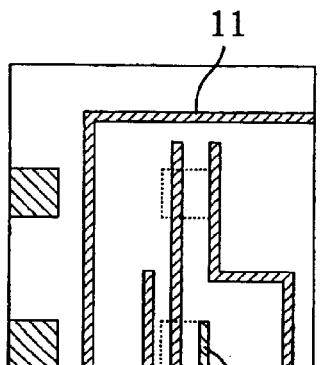
Figure 9C:
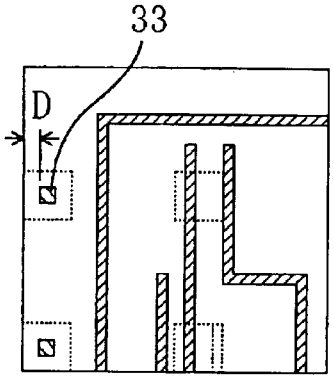

Subsequently, in Step SB4, part of the second simple-figure dummy pattern 31 where the second simple-figure dummy pattern 31 and the first enlarged wiring pattern 12 overlap each other is removed, thereby forming a third dummy pattern 32 shown in FIG. 9B. This process step is performed by third pattern logical subtraction means 112 shown in FIG. 8.

Then, in Step SB5, the third dummy pattern 32 is shrunk in the x and y directions by a predetermined value D (where D<W and D is 0.125 μm, for example), thereby forming a first shrunk dummy pattern 33. In this case, the predetermined value D is set to half of the minimum value satisfying a design rule for a wiring pattern (i.e., 0.25 μm in this embodiment) in a semiconductor fabrication process and to be smaller than half of the length of one side of the square. This process step is performed by first pattern shrinking means 113 shown in FIG. 8.

Thereafter, in Step SB6, the first shrunk dummy pattern 33 is enlarged in the x and y directions by the predetermined value D, thereby forming a fourth dummy pattern 34 (i.e., a restored dummy pattern). This process step is performed by fourth pattern enlarging means 114 shown in FIG. 8. The fourth dummy pattern 34 is formed by removing parts of the third dummy pattern 32 having shapes that do not meet the design rule of the wiring pattern in the semiconductor fabrication process.

Figure 9D:
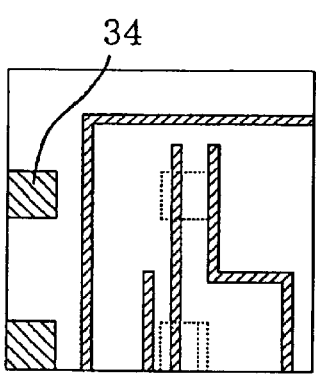
Figure 9E:
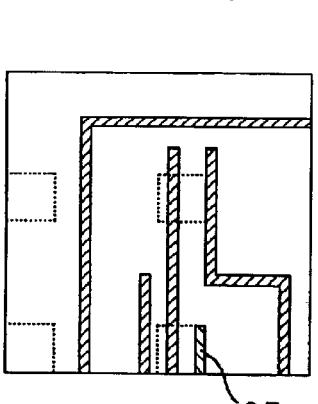

Then, in Step SB7, part of the third dummy pattern 32 where the third and fourth dummy patterns 32 and 34 overlap each other is removed, thereby forming a fifth dummy pattern 35 shown in FIG. 9E. This process step is performed by third pattern logical subtraction means 115 shown in FIG. 8.

Figure 9F:
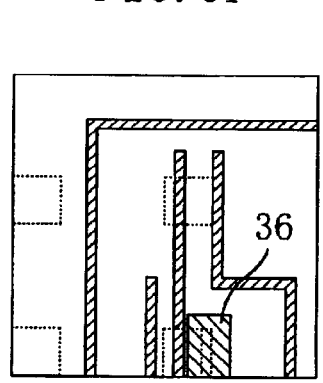

Subsequently, in Step SB8, the fifth dummy pattern 35 is enlarged in the x and y directions by a predetermined value E (e.g., 0.125 μm), thereby forming a sixth dummy pattern 36 shown in FIG. 9F. This process step is performed by fifth pattern enlarging means 116 shown in FIG. 8.

Figure 9G:
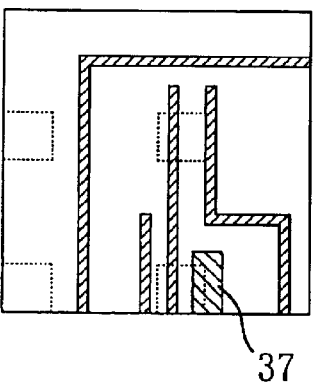

Thereafter, in Step SB9, part of the sixth dummy pattern 36 where the sixth dummy pattern 36 and the first enlarged wiring pattern 12 overlap each other is removed, thereby forming a seventh dummy pattern 37 shown in FIG. 9G. This process step is performed by fourth pattern logical subtraction means 117 shown in FIG. 8.

Figure 9H:
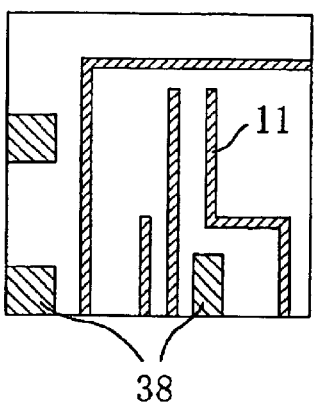
Figure 9I:
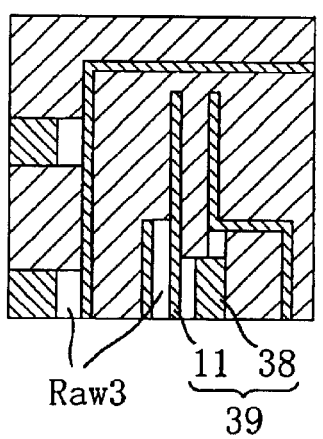

Then, in Step SB10, the fourth dummy pattern 34 shown in FIG. 9D and the seventh dummy pattern 37 shown in FIG. 9G are combined, thereby forming an eighth dummy pattern 38 shown in FIG. 9H. This process step is performed by second pattern logical summation means 118 shown in FIG. 8.

Then, in Step SB11, the first wiring pattern 11 shown in FIG. 3A and the eighth dummy pattern 38 shown in FIG. 9G are combined, thereby forming a fourth wiring pattern 39 shown in FIG. 3I. This process step is performed by third pattern logical summation means 119 shown in FIG. 8.

This fourth wiring pattern 39 is a final wiring pattern including the first wiring pattern 11 as an actual wiring pattern and the eighth dummy pattern 38 (i.e., the logical sum of the fourth and seventh dummy patterns 34 and 37). A conductive film is formed as the eighth dummy pattern 38. This conductive film is made of the same conductive material as that of the first-wiring pattern 11, which is an actual wiring pattern, but does not function as wiring. In this embodiment, parts of the fourth wiring pattern 39 where wires are spaced by the value W or smaller are turned into air gap regions Raw3 where no insulating film exists. The air gap regions Raw3 are shown as blank spaces (i.e., regions other than the hatched regions) in FIG. 9I.

Although not shown, according to the method for designing interconnection of this embodiment, as in the interconnection structure which is formed by the designing method of the first embodiment as shown in FIG. 20, a final wiring pattern including a dummy pattern is also formed in an interconnect layer to be designed. Air gap regions are created in parts of the interconnect layer where the wire-to-wire space is narrower than a predetermined value.

Thus, according to the third embodiment, the fourth dummy pattern 34 is formed in regions apart from the first wiring pattern 11 as an actual wiring pattern by the predetermined value A using the second simple-figure pattern 31 made of simple figures. In addition, figures that have disappeared during the shrinking process step for forming the fourth dummy pattern 34 are generated again in enlarged shapes at positions away from their original positions, thereby forming the seventh dummy pattern 37 as shown in FIG. 9G. Then, the eighth dummy pattern 38 is obtained from the logical sum of the fourth and seventh dummy patterns (see FIG. 9H).

In this manner, according to this embodiment, it is possible to shrink figures removed during the shrinking process step. Thus, if a semiconductor device is fabricated using the eighth dummy pattern 38, a large number of air gap regions in which no insulating film exists are created between the first wiring pattern 11 and the eighth dummy pattern 38, as compared to the case where the shrinking process step is not performed. As a result, wire-to-wire capacitance can be effectively reduced and, moreover, the flatness of the interconnect layer can be maintained.

In this embodiment, a square is used as the simple figure that is a basic component of the second simple-figure dummy pattern 31. Instead, a shape such as triangle, circle, or polygon may be used as the simple figure.

Embodiment 4

Figure 10:
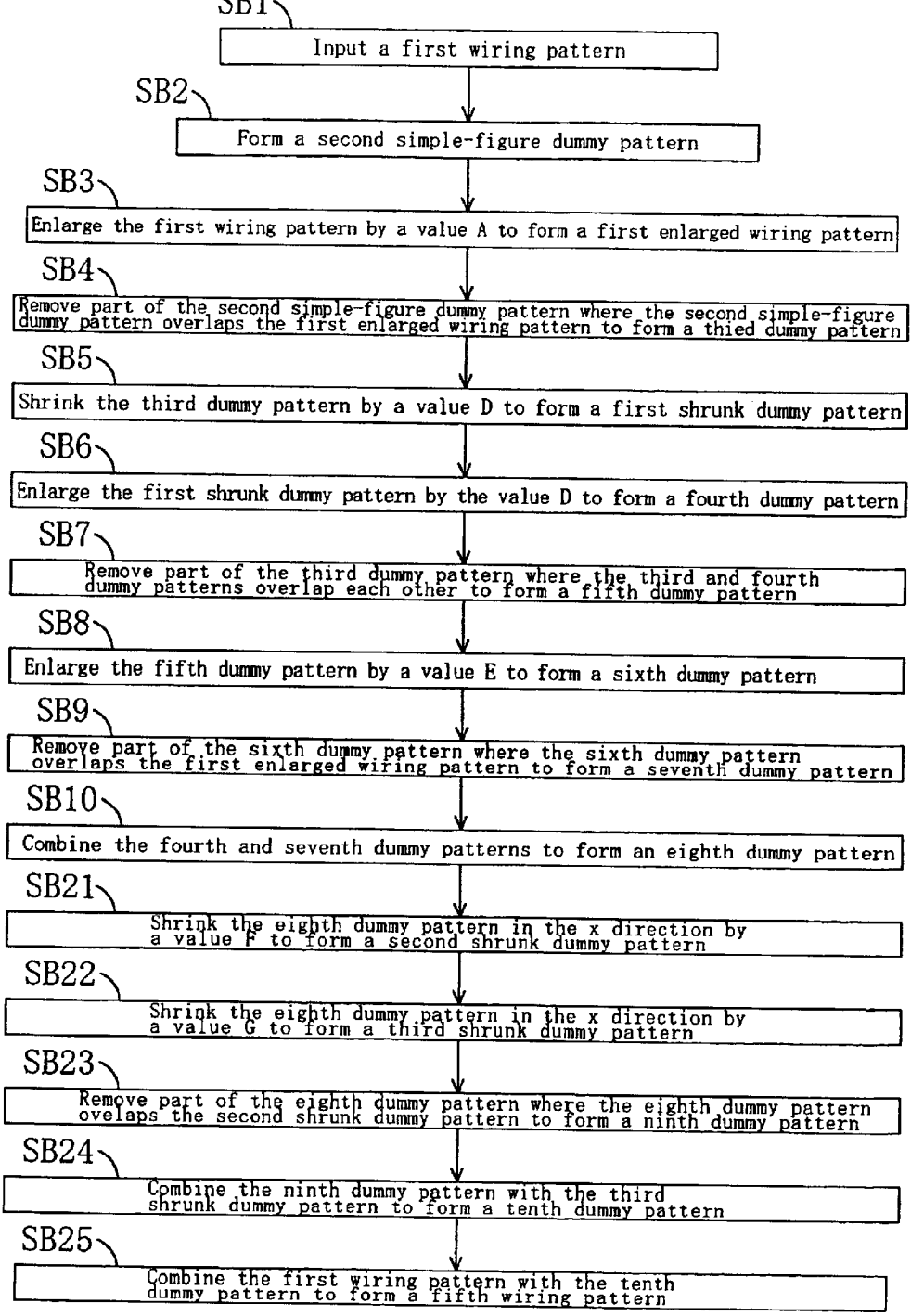
FIG. 10 is a flowchart illustrating a procedure of forming patterns for designing an interconnection structure according to a fourth embodiment of the present invention.
Figure 11:
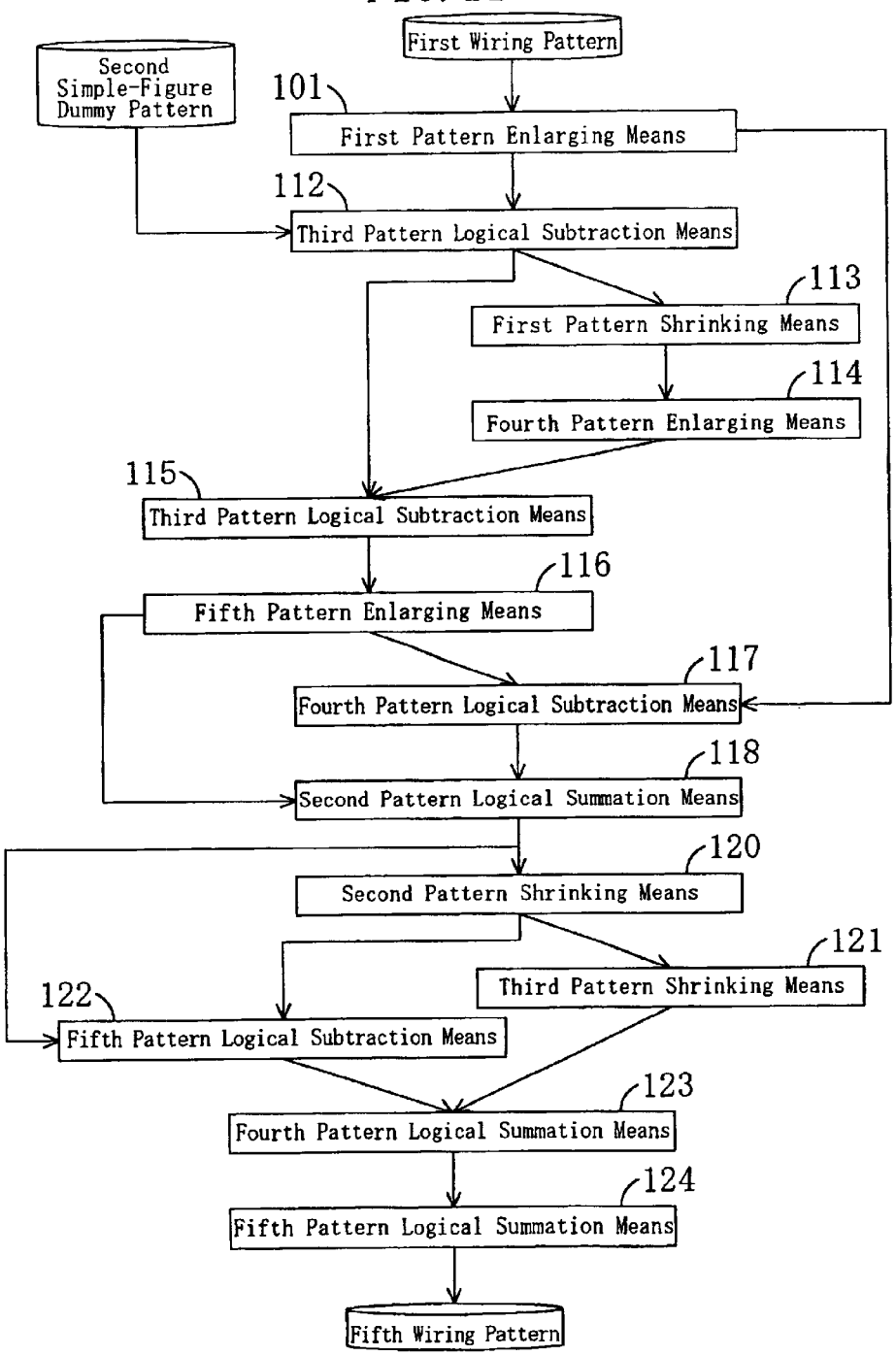
FIG. 11 is a block diagram schematically showing components of a pattern forming device in the fourth embodiment.

FIG. 10 is a flowchart illustrating a procedure of forming patterns for designing an interconnection structure according to a fourth embodiment of the present invention. FIG. 11 is a block diagram schematically showing components of a pattern forming device in the fourth embodiment. FIGS. 12A through 12E are plan views showing patterns formed during the pattern forming process for designing the interconnection structure of the fourth embodiment. Hereinafter, a pattern forming method for designing the interconnection structure of this embodiment will be described with reference to FIG. 11 and FIGS. 12A through 12E according to the flowchart in FIG. 10.

First, as in the third embodiment, Steps SB1 through SB10 are performed. Specifically, a first wiring pattern 11 which is an actual pattern is input. Then, after second simple-figure dummy pattern 31, first enlarged wiring pattern 12, third dummy pattern 32, first shrunk dummy pattern 33, and fourth through seventh dummy patterns 34 through 37 have been formed, the fourth and seventh dummy patterns 34 and 37 are combined, thereby forming an eighth dummy pattern 38. These process steps are performed by first pattern enlarging means 111, third pattern logical subtraction means 112, first pattern shrinking means 113, fourth pattern enlarging means 114, third pattern logical subtraction means 115, fifth pattern enlarging means 116, fourth pattern logical subtraction means 117, and second pattern logical summation means 118, shown in FIG. 8.

Next, in Step SC20, the eighth dummy pattern 38 shown in FIG. 9H is shrunk in the x direction by a predetermined value F (e.g., 0.40 $\mu$m), thereby forming a second shrunk dummy pattern 41. This process step is performed by second pattern shrinking means 120 shown in FIG. 11. In this case, the predetermined value F satisfies a design rule for a wiring pattern (i.e., 0.25 $\mu$m in this embodiment) in a semiconductor fabrication process and is preferably one-fifth of the length (2.00 $\mu$m in this embodiment) of one side of the square that is a basic component of the second simple-figure dummy pattern 31.

Then, in Step 21, the eighth dummy pattern 38 is shrunk in the x direction by a predetermined value G (e.g., 0.80 $\mu$m), thereby forming a third shrunk dummy pattern 42. This process step is performed by third pattern shrinking means 121 shown in FIG. 11. In this case, the predetermined value G is preferably two-fifth of the length of one side of the square that is the basic component of the second simple-figure dummy pattern 31.

Figure 12A:
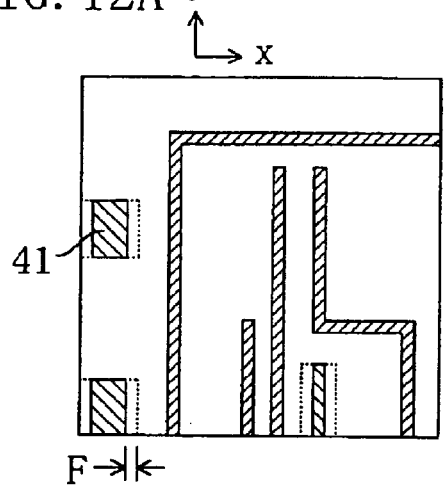
FIGS. 12A through 12E are plan views showing patterns formed during the pattern forming process for designing the interconnection structure of the fourth embodiment.
Figure 12B:
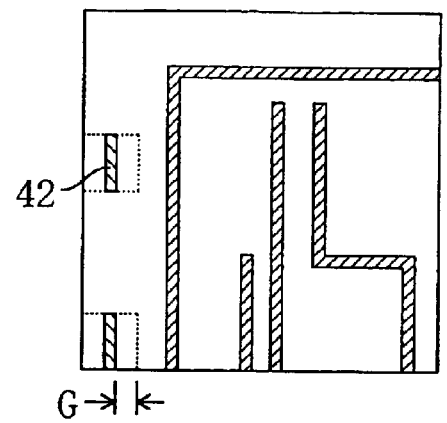
Figure 12C:
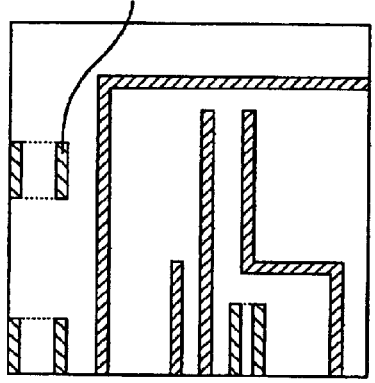

Thereafter, in Step SB22, part of the eighth dummy pattern 38 where the eighth dummy pattern 38 and the second shrunk dummy pattern 41 overlap each other is removed, thereby forming a ninth dummy pattern 43 shown in FIG. 12C. This process step is performed by fifth pattern logical subtraction means 122 shown in FIG. 11.

Figure 12D:
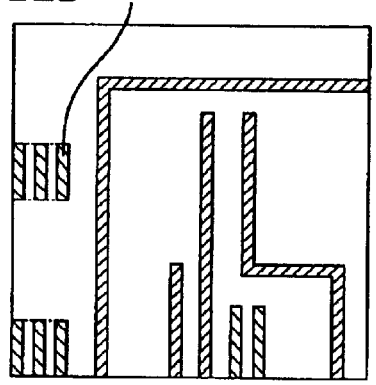

Then, in Step SB23, the ninth dummy pattern 43 shown in FIG. 12C and the third shrunk dummy pattern 42 shown in FIG. 12B are combined, thereby forming a tenth dummy pattern 44 shown in FIG. 12D. This process step is performed by fourth pattern logical summation means 123 shown in FIG. 11.

Figure 12E:
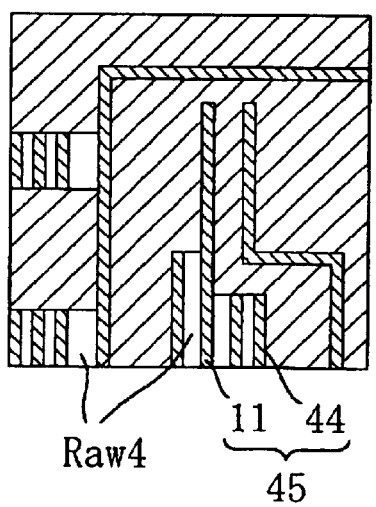

Then, in Step SB24, the first wiring pattern 11 shown in FIG. 3A and the tenth dummy pattern 44 shown in FIG. 12D are combined, thereby forming a fifth wiring pattern 45 shown in FIG. 12E. This process step is performed by fifth pattern logical summation means 124 shown in FIG. 11.

This fifth wiring pattern 45 is a final wiring pattern including the first wiring pattern 11 as an actual wiring pattern and the tenth dummy pattern 45. A conductive film is formed as the tenth dummy pattern 45. This conductive film is made of the same conductive material as that of the first wiring pattern, which is an actual wiring pattern, but does not function as wiring. In this embodiment, parts of the fifth wiring pattern 45 where wires are spaced by the value W or smaller are turned into air gap regions Raw4 where no insulating film exists. The air gap regions Raw4 are shown as blank spaces (i.e., regions other than the hatched regions) in FIG. 12E.

Although not shown, according to the method for designing interconnection of this embodiment, as in the interconnection structure formed by the designing method of the first embodiment as shown in FIG. 20, a final wiring pattern including a dummy pattern is also formed in an interconnect layer to be designed. Air gap regions are created in parts of the interconnect layer where the wire-to-wire space is narrower than a predetermined value.

According to the fourth embodiment, basically, the same advantages as in the third embodiment can be obtained. In addition, since the eighth dummy pattern 38 is separated into striped pieces, it is possible to reduce the wire-to-wire capacitance exhibited when air gap regions are created, and to suppress a signal delay on a line adjacent to the fourth dummy pattern.

In this embodiment also, a square is used as the simple figure that is a basic component of the second simple-figure dummy pattern 31. Instead, a shape such as triangle, circle, or polygon may be used as the simple figure.

The second and third shrunk dummy patterns 41 and 42 are formed by shrinking the eighth dummy pattern 38 in the x direction by the predetermined values F and G, respectively, through the pattern shrinking means. Instead, the second and third shrunk dummy patterns 41 and 42 may be formed by shrinking the eighth dummy pattern 38 in the y direction by the predetermined values F and G, respectively.

Embodiment 5

Figure 13:
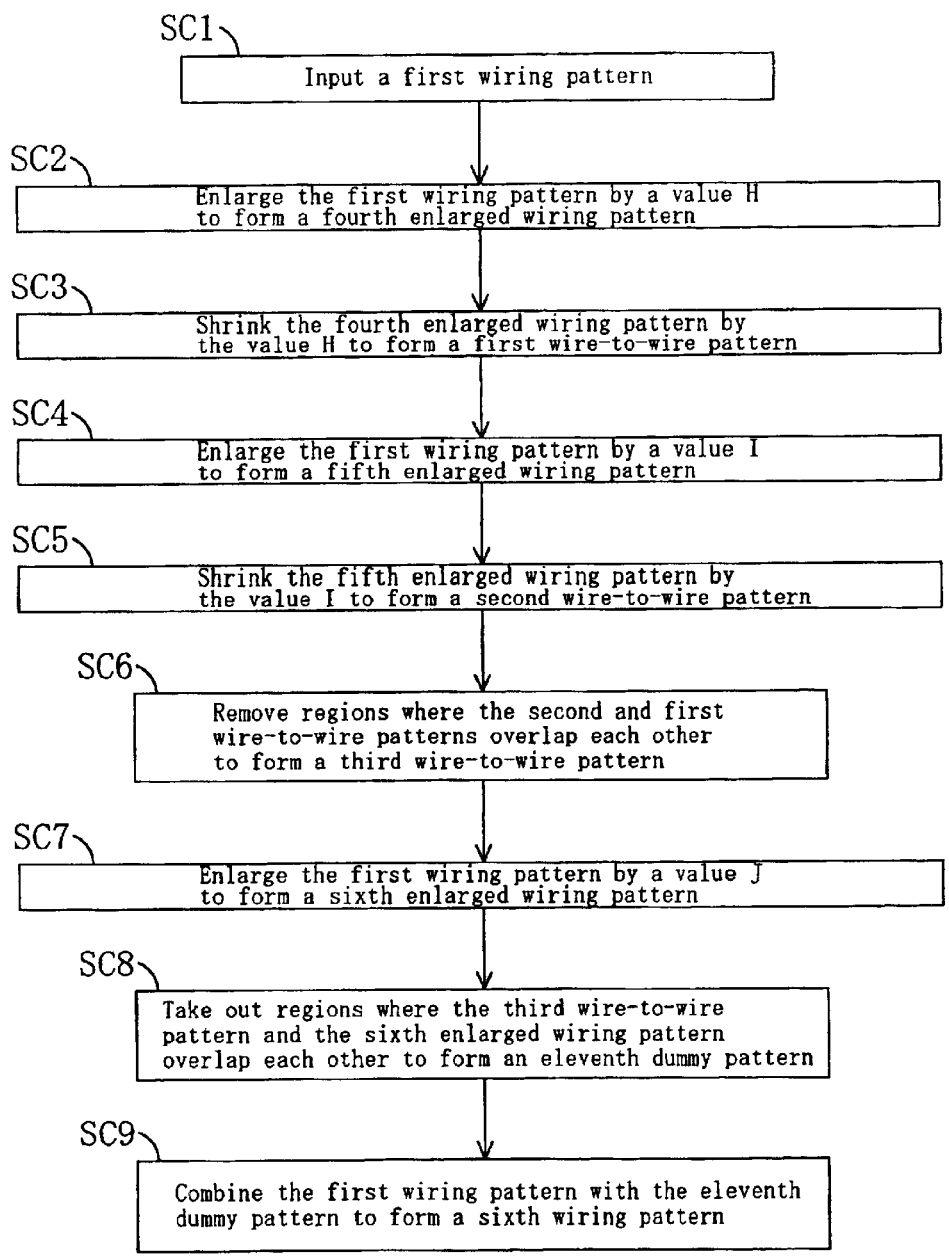
FIG. 13 is a flowchart illustrating a procedure of forming patterns for designing an interconnection structure according to a fifth embodiment of the present invention.
Figure 14:
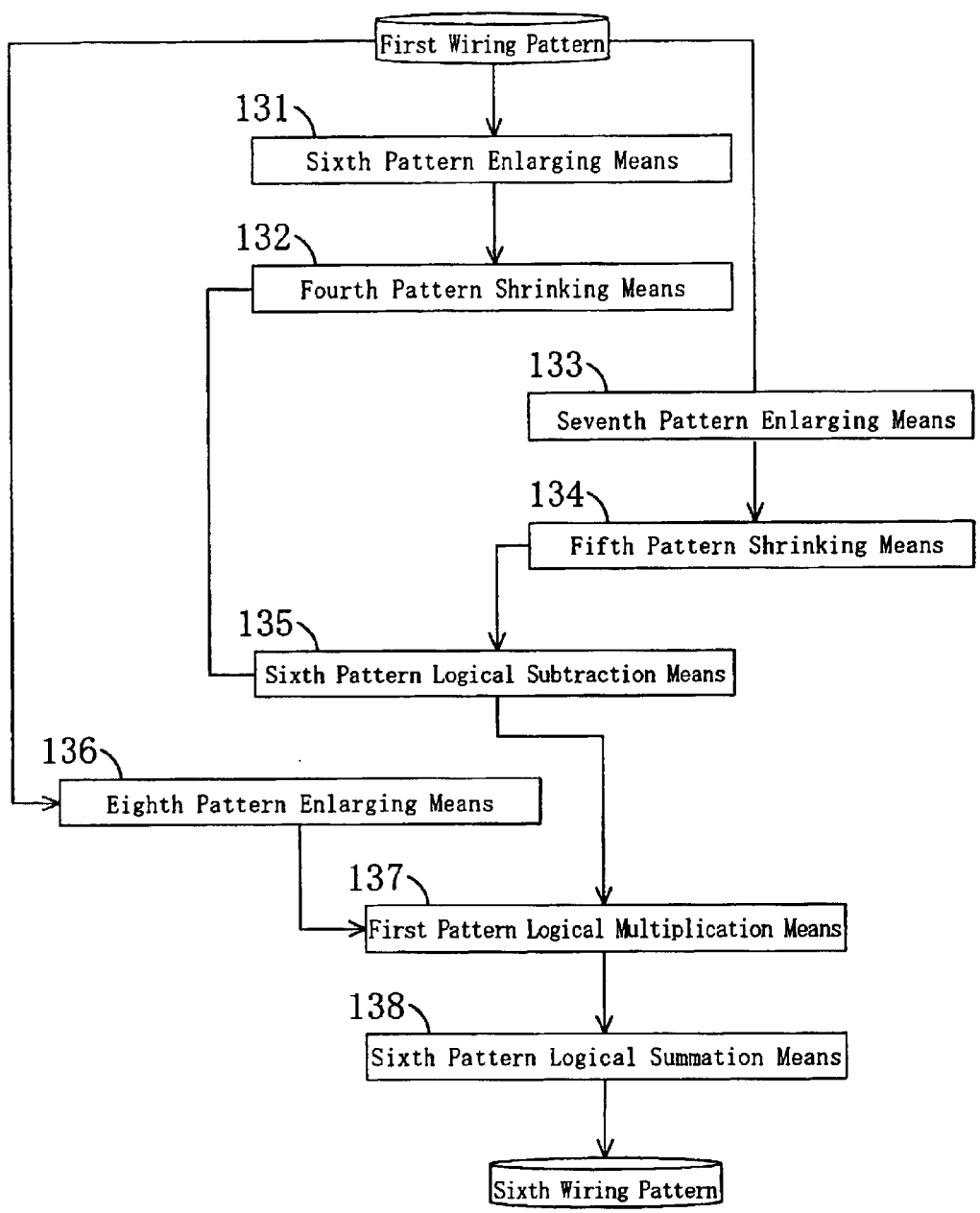
FIG. 14 is a block diagram schematically showing components of a pattern forming device in the fifth embodiment.

FIG. 13 is a flowchart illustrating a procedure of forming patterns for designing an interconnection structure according to a fifth embodiment of the present invention. FIG. 14 is a block diagram schematically showing components of a pattern forming device in the fifth embodiment. FIGS. 15A through 15H are plan views showing patterns formed during the pattern forming process for designing the interconnection structure of the fifth embodiment. Hereinafter, a pattern forming method for designing the interconnection structure of this embodiment will be described with reference to FIG. 14 and FIGS. 15A through 15H according to the flowchart in FIG. 13.

First, in Step SC1, a first wiring pattern 11, which is an actual wiring pattern and shown in FIG. 3A, is taken out from a data base used for a design and then input to a personal computer used for the design, for example.

Figure 15A:
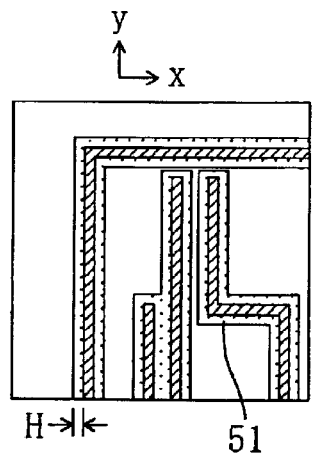
FIGS. 15A through 15H are plan views showing patterns formed during the pattern forming process for designing the interconnection structure of the fifth embodiment.

Next, in Step SC2, the first wiring pattern 11 shown in FIG. 3A is enlarged in the x and y directions by a predetermined value H (where H≈W/2 and H is 0.13 $\mu$m, for example), thereby forming a fourth enlarged wiring pattern 51 shown in FIG. 15A. This process step is performed by sixth pattern enlarging means 131 shown in FIG. 14. In this embodiment, the predetermined value H is half of the minimum width of a space (e.g., about 0.5 $\mu$m) in which an air gap region is to be created.

Figure 15B:
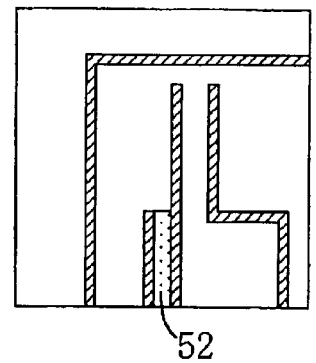

Then, in Step SC3, the fourth enlarged wiring pattern 51 shown in FIG. 15A is shrunk in the x and y directions by a predetermined value H, thereby forming a first wire-to-wire pattern 52 shown in FIG. 15B. This process step is performed by fourth pattern shrinking means 132 shown in FIG. 14.

Subsequently, in Step SC4, the first wiring pattern 11 shown in FIG. 3A is enlarged in the x and y directions by a predetermined value I (where I>W/2 and I is 0.15 $\mu$m, for example), thereby forming a fifth enlarged wiring pattern 53 shown in FIG. 15C. This process step is performed by seventh pattern enlarging means 133 shown in FIG. 14. In this case, the predetermined value I is obtained by adding a predetermined value J used in Step SC7 to half of the maximum value of the width of a space for an air gap region.

Figure 15C:
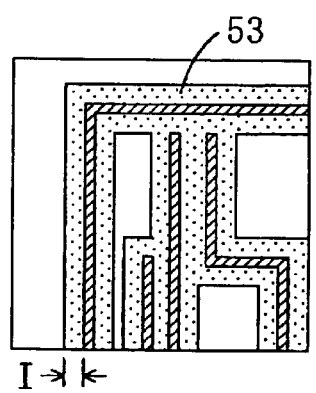
Figure 15D:
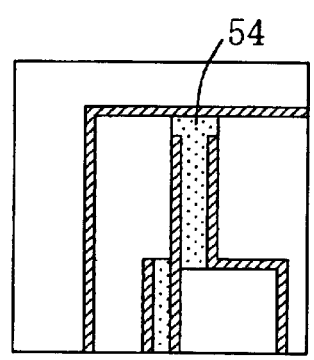

Thereafter, in Step SC5, the fifth enlarged wiring pattern 53 shown in FIG. 15C is shrunk in the x and y directions by the predetermined value I, thereby forming a second wire-to-wire pattern 54 shown in FIG. 15D. This process step is performed by fifth pattern shrinking means 134 shown in FIG. 14.

Figure 15E:
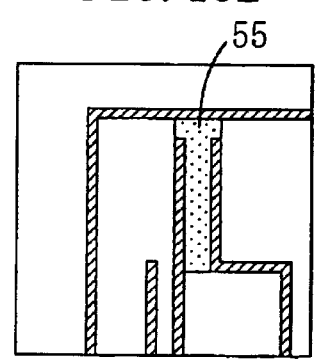

Then, in Step SC6, part of the second wire-to-wire pattern 54 where the first and second wire-to-wire patterns 52 and 54 overlap each other is removed, thereby forming a third wire-to-wire pattern 55 shown in FIG. 15E. This process step is performed by sixth pattern logical subtraction means 135 shown in FIG. 14.

Figure 15F:
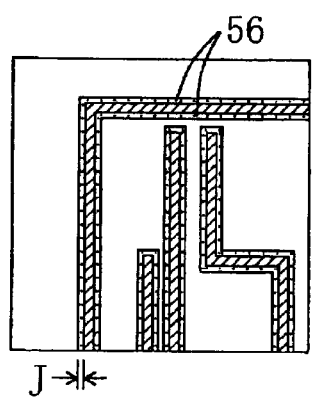

Then, in Step SC7, the first wiring pattern 11 shown in FIG. 3A is enlarged in the x and y directions by a predetermined value J (where J<W/2 and J is 0.01 $\mu$m, for example), thereby forming a sixth enlarged wiring pattern 56 shown in FIG. 15F. This process step is performed by eighth pattern enlarging means 136 shown in FIG. 14. In this case, the predetermined value J needs to be smaller than half of the minimum value of the width of a space satisfying a design rule for a wiring pattern in a semiconductor fabrication process.

Figure 15G:
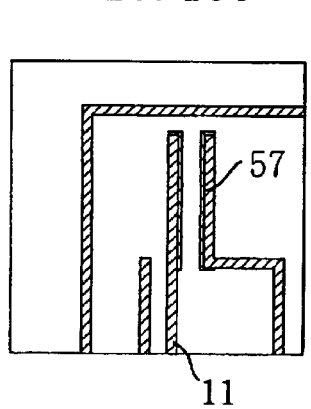

Subsequently, in Step SC8, regions where the third wire-to-wire pattern 55 and the sixth enlarged wiring pattern 56 overlap each other are taken out, thereby forming an eleventh dummy pattern 57 as shown in FIG. 15G. This process step is performed by first pattern logical multiplication means 137 shown in FIG. 14.

Figure 15H:
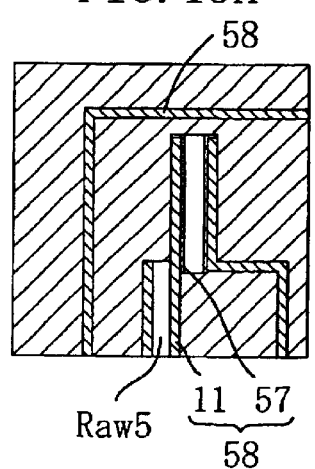

Then, in Step SC9, the first wiring pattern 11 shown in FIG. 3A and the eleventh dummy pattern 57 shown in FIG. 15G are combined, thereby forming a sixth wiring pattern 58 shown in FIG. 15H. This process step is performed by sixth pattern logical summation means 138 shown in FIG. 14.

This sixth wiring pattern 58 is a final wiring pattern including the first wiring pattern 11 as an actual wiring pattern and the eleventh dummy pattern 57. A conductive film is formed as the eleventh dummy pattern 57. This conductive film is made of the same conductive material as that of the first wiring pattern, which is an actual wiring pattern, but does not function as wiring. In this embodiment, parts of the sixth wiring pattern 58 where wires are spaced by the value W or smaller are turned into air gap regions Raw5 where no insulating film exists. The air gap regions Raw5 are shown as blank spaces (i.e., regions other than the hatched regions) in FIG. 15H.

Although not shown, according to the method for designing interconnection of this embodiment, as in the interconnection structure formed by the designing method of the first embodiment as shown in FIG. 20, a final wiring pattern including a dummy pattern is also formed in an interconnect layer to be designed. Air gap regions are created in parts of the interconnect layer where the wire-to-wire space is narrower than a predetermined value.

According to the fifth embodiment, a pattern (i.e., the eleventh dummy pattern 57) adjacent to an actual wiring pattern (i.e., the first wiring pattern 11) is additionally formed, thereby narrowing wire-to-wire spaces. That is to say, according to this embodiment, even in a case where a wire-to-wire space in an actual wiring pattern is slightly wider than the value W and, therefore, it is difficult to form a dummy pattern in the space by the methods of the first through third embodiments, a dummy pattern for creating air gap regions can be formed as intended. Thus, wire-to-wire capacitance can be suppressed in the interconnection structure by using this dummy pattern.

Embodiment 6

Figure 16:
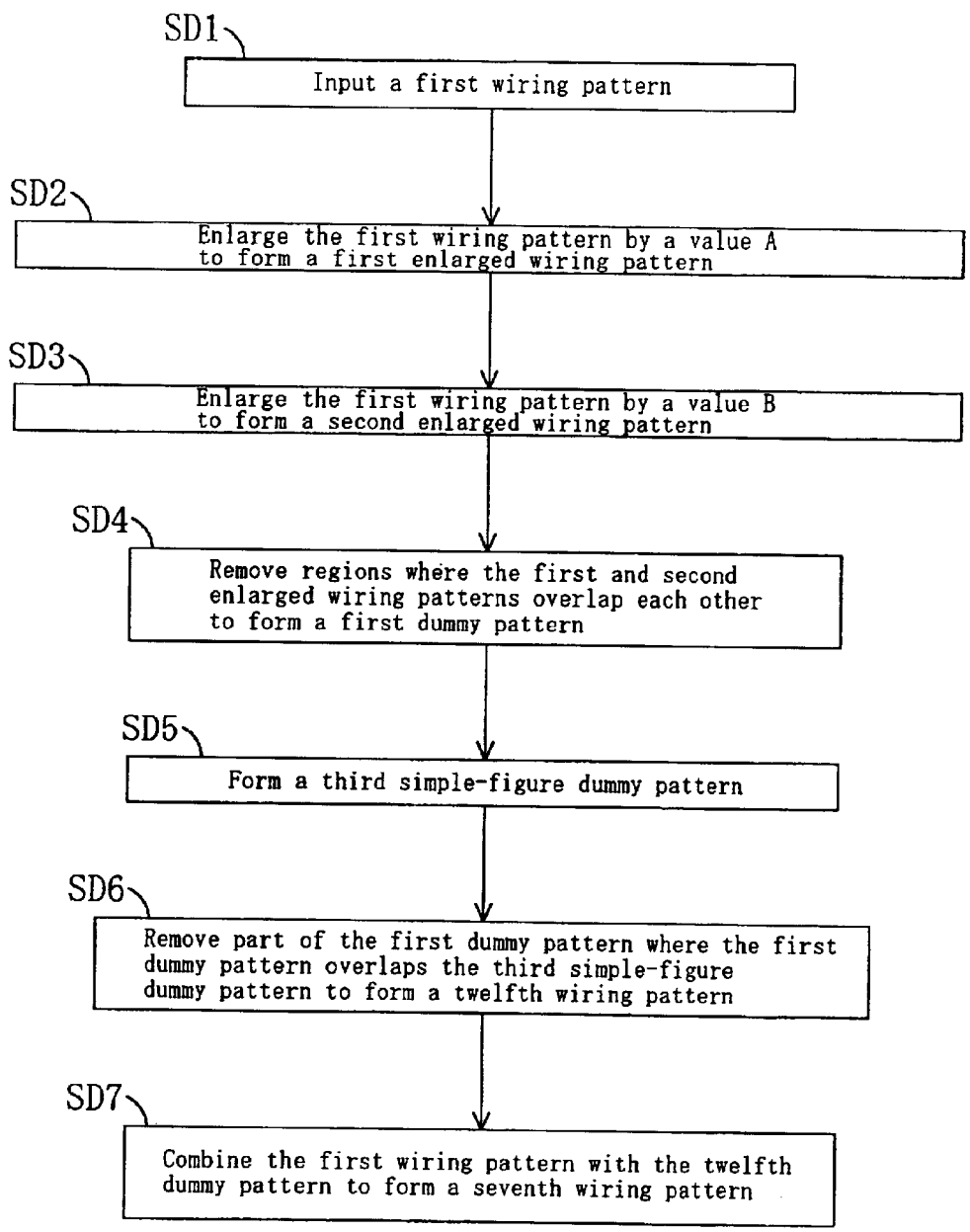
FIG. 16 is a flowchart illustrating a procedure of a pattern forming method for designing an interconnection structure according to a sixth embodiment of the present invention.
Figure 17:
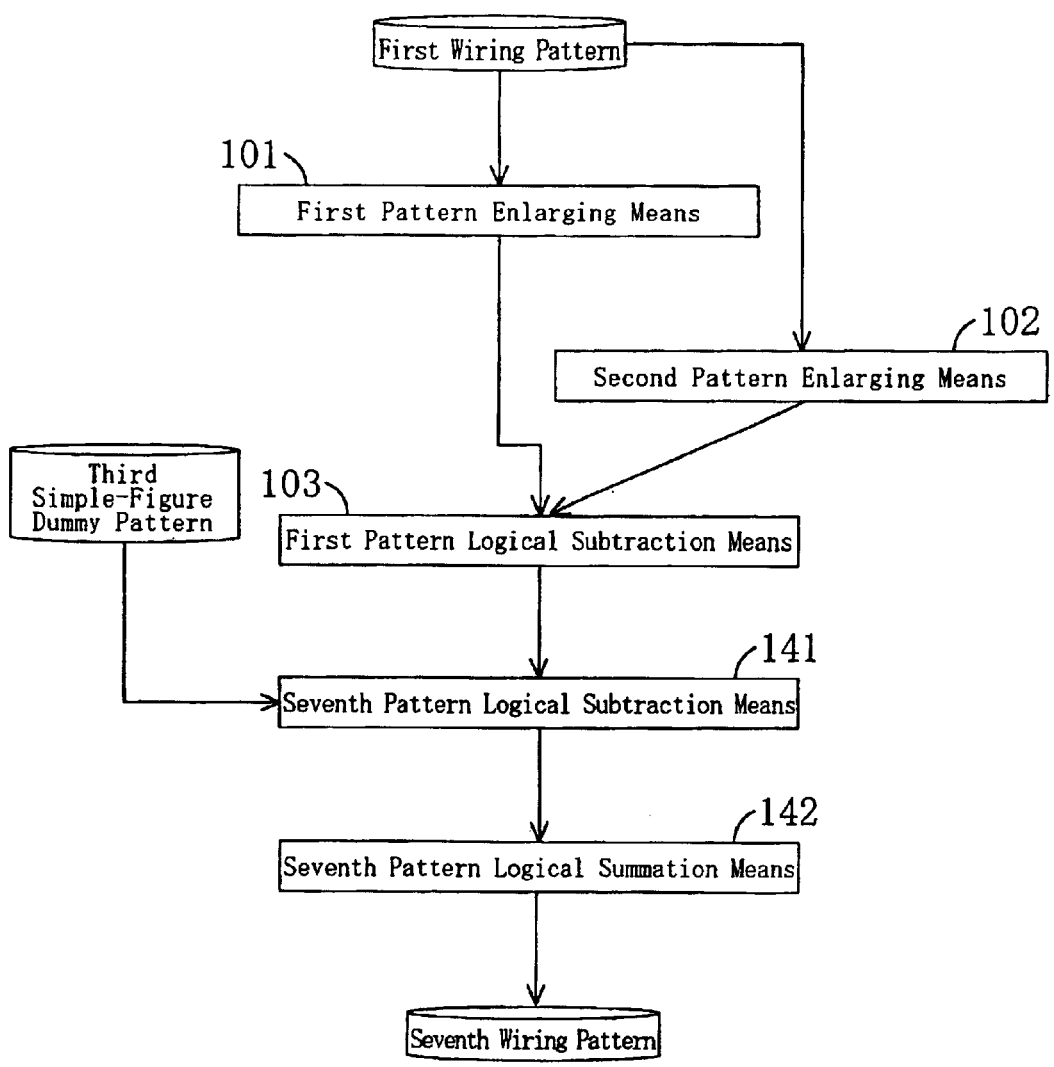
FIG. 17 is a block diagram schematically showing components of a pattern forming device in the sixth embodiment.
Figure 18A:
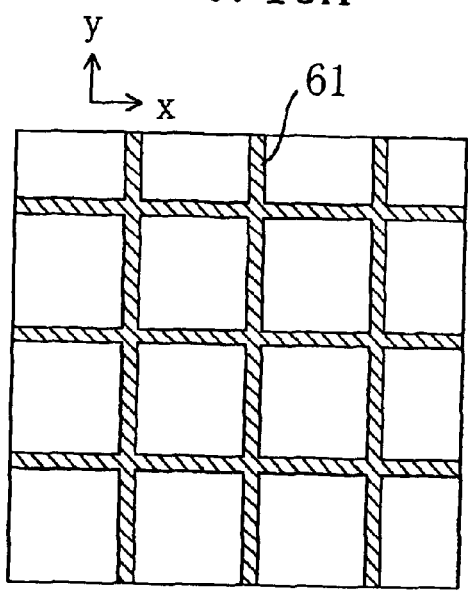
FIGS. 18A through 18C are plan views showing patterns formed during the pattern forming process for designing the interconnection structure of the sixth embodiment.
Figure 18B:
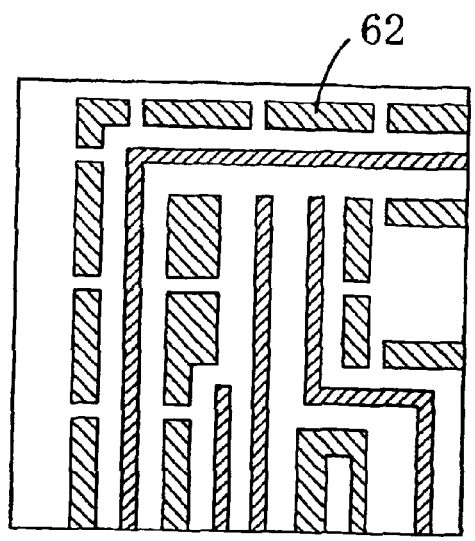
Figure 18C:
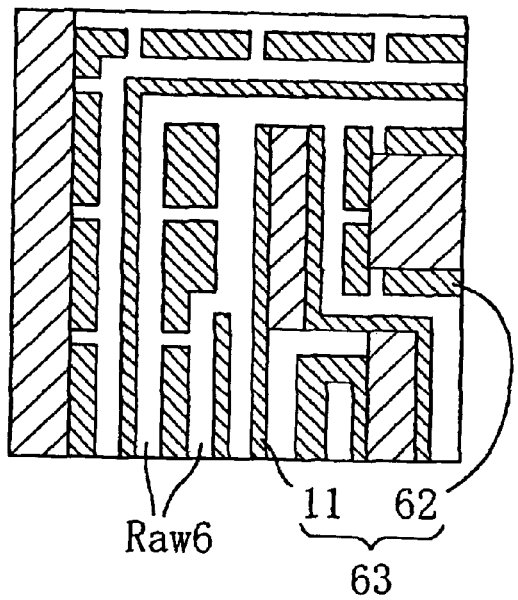

FIG. 16 is a flowchart illustrating a procedure of a pattern forming method for designing an interconnection structure according to a sixth embodiment of the present invention. FIG. 17 is a block diagram schematically showing components of a pattern forming device in the sixth embodiment. FIGS. 18A through 18C are plan views showing patterns formed during the pattern forming process for designing the interconnection structure of the sixth embodiment. Hereinafter, a pattern forming method for designing the interconnection structure of this embodiment will be described with reference to FIG. 17 and FIGS. 18A through 18C according to the flowchart shown in FIG. 16.

First, Steps SD1 through SD4 are performed as the Steps SA1 through SA4 in the first embodiment. Specifically, in Step SD1, a first wiring pattern 11 that is an actual wiring pattern and shown in FIG. 3A is input. Then, in Step SD2, the first wiring pattern 11 is enlarged in the x and y directions by a predetermined value A (e.g., 0.5 μm), thereby forming a first enlarged wiring pattern 12 shown in FIG. 3B. Subsequently, in Step SD3, the first wiring pattern 11 is enlarged again in the x and y directions by a predetermined value B (e.g., 0.75 μm), thereby forming a second enlarged wiring pattern 13 shown in FIG. 3B. Then, in Step SD4, part of the second enlarged wiring pattern 13 in which the first and second enlarged wiring patterns 12 and 13 overlap each other is removed, thereby forming a first dummy pattern 14 shown in FIG. 3D. The foregoing process steps are performed by first pattern enlarging means 101, second pattern enlarging means 102, and first pattern logical subtraction means 103, shown in FIG. 17.

Next, in Step SD5, a third simple-figure dummy pattern 61, which is formed in a lattice, is defined as shown in FIG. 6A. In this case, the width of the third simple-figure dummy pattern 61 is preferably set to the minimum width of a space between wiring patterns (0.25 μm in this embodiment) satisfying a design rule in a semiconductor fabrication process.

Thereafter, in Step SD6, part of the first dummy pattern 14 where the first dummy pattern 14 and the third simple-figure dummy pattern 61 overlap each other is removed, thereby forming a twelfth dummy pattern 62 shown in FIG. 18B. This process step is performed by seventh pattern logical subtraction means 184 shown in FIG. 17.

Then, in Step SD7, the first wiring pattern 11 shown in FIG. 3A and the twelfth dummy pattern 62 shown in FIG. 18B are combined, thereby forming a seventh wiring pattern 63 shown in FIG. 18C. This process step is performed by seventh pattern logical summation means 185 shown in FIG. 17.

According to the sixth embodiment, regions where an actual wiring pattern (i.e., the first wiring pattern 11 in this embodiment) and a dummy pattern (i.e., the twelfth dummy pattern 62 in this embodiment) are separated from each other so that the actual wiring pattern and the dummy pattern are not continuous. Thus, the capacitance between the actual pattern and the dummy pattern can be reduced. In this embodiment also, parts of the seventh wiring pattern 63 where wires are spaced by the value W or smaller are turned into air gap regions Raw6 where no insulating film exists. The air gap regions Raw6 are shown as blank spaces (i.e., regions other than the hatched regions) in FIG. 18C.

Although not shown, according to the method for designing interconnection of this embodiment, as in the interconnection structure formed by the designing method of the first embodiment as shown in FIG. 20, a final wiring pattern including a dummy pattern is also formed in an interconnect layer to be designed. Air gap regions are provided in parts of the interconnect layer where the wire-to-wire space is narrower than a predetermined value. As a result, the parasitic capacitance between wires can be reduced.

Other Embodiments

In the foregoing embodiments, the first wiring pattern as an actual wiring pattern may be a pattern which has been already designed and taken out from a data base, for example, or may be newly formed.

What is claimed is:

1. A method for designing an interconnection structure of an interconnect layer in a semiconductor integrated circuit device, the method comprising the steps of:

enlarging an actual wiring pattern by a first value being equal to or smaller than a predetermined value, thereby forming a first enlarged wiring pattern;

enlarging the actual wiring pattern by a second value being larger than the first value, thereby forming a second enlarged wiring pattern;

removing part of the second enlarged wiring pattern where the first and second enlarged wiring patterns overlap each other, thereby forming a first dummy pattern;

combining the actual wiring pattern with the first dummy pattern, thereby forming a first final wiring pattern; and defining a gap in the first final wiring pattern with a value being equal to or smaller than the predetermined value that will be turned into an air gap region in the interconnect layer.

2. The method of claim 1, further comprising the steps of:

forming a simple-figure dummy pattern including a plurality of simple figures, at least two of the plurality of simple figures separated by a third value being equal to or smaller than the predetermined value;

enlarging the first final wiring pattern by a fourth value being equal to or smaller than the predetermined value, thereby forming a third enlarged wiring pattern;

removing part of the simple-figure dummy pattern where the simple-figure dummy pattern and the third enlarged wiring pattern overlap each other, thereby forming a second dummy pattern;

combining the first final wiring pattern with the second dummy pattern, thereby forming a second final wiring pattern; and re-defining a gap in the second final wiring pattern with a value being equal to or smaller than the predetermined value that will be turned into an air gap region in the interconnect layer instead of the gap defined in the first final wiring pattern.

3. The method of claim 1, further comprising the steps of:

dividing the first dummy pattern into a plurality of dummy patterns, at least two of the plurality of dummy patterns separated by a fifth value being equal to or smaller than the predetermined value;

combining the actual wiring pattern with the plurality of dummy patterns instead of the first dummy pattern, thereby forming a third final wiring pattern; and re-defining a gap in the third final wiring pattern with a value being equal to or smaller than the predetermined value that will be turned into an air gap region in the interconnect layer instead of the gap defined in the first final wiring pattern.

4. A method for designing an interconnection structure of an interconnect layer in a semiconductor integrated circuit device, the method comprising the steps of:

enlarging an actual wiring pattern by a first value being equal to or smaller than a predetermined value, thereby forming a first enlarged wiring pattern;

forming a second enlarged wiring pattern so that the second wiring pattern is larger than the first enlarged wiring pattern by a second value in all sides of the first enlarged wiring pattern;

removing part of the second enlarged wiring pattern where the first and second enlarged wiring patterns overlap each other, thereby forming a first dummy pattern;

combining the actual wiring pattern with the first dummy pattern, thereby forming a first final wiring pattern; and defining a gap in the first final wiring pattern with a value being equal to or smaller than the predetermined value that will be turned into an air gap region in the interconnect layer.

5. The method of claim 4, further comprising the steps of:

forming a simple-figure dummy pattern including a plurality of simple figures, at least two of the plurality of simple figures separated by a third value being equal to or smaller than the predetermined value;

forming a third enlarged wiring pattern so that the third wiring pattern is larger than the first final wiring pattern by a fourth value being equal to or smaller than the predetermined value in all sides of the first final wiring pattern;

removing part of the simple-figure dummy pattern where the simple-figure dummy pattern and the third enlarged wiring pattern overlap each other, thereby forming a second dummy pattern;

combining the first final wiring pattern with the second dummy pattern, thereby forming a second final wiring pattern; and re-defining a gap in the second final wiring pattern with a value being equal to or smaller than the predetermined value that will be turned into an air gap region in the interconnect layer instead of the gap defined in the first final wiring pattern.

6. The method of claim 4, further comprising the steps of:

dividing the first dummy pattern into a plurality of dummy patterns, at least two of the plurality of dummy patterns separated by a fifth value being equal to or smaller than the predetermined value;

combining the actual wiring pattern with the plurality of dummy patterns instead of the first dummy pattern, thereby forming a third final wiring pattern; and re-defining a gap in the third final wiring pattern with a value being equal to or smaller than the predetermined value that will be turned into an air gap region in the interconnect layer instead of the gap defined in the first final wiring pattern.

* * * * *